United States Patent
Zewail et al.

(10) Patent No.: US 8,569,695 B2
(45) Date of Patent: Oct. 29, 2013

(54) PHOTON INDUCED NEAR FIELD ELECTRON MICROSCOPE AND BIOLOGICAL IMAGING SYSTEM

(71) Applicant: California Institute of Technology, Pasadena, CA (US)

(72) Inventors: Ahmed H. Zewail, Pasadena, CA (US); David J. Flannigan, Temple City, CA (US); Brett Barwick, Berlin, CT (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/863,742

(22) Filed: Apr. 16, 2013

(65) Prior Publication Data
US 2013/0234022 A1  Sep. 12, 2013

Related U.S. Application Data

(63) Continuation of application No. 12/883,948, filed on Sep. 16, 2010, now Pat. No. 8,429,761.

(60) Provisional application No. 61/367,262, filed on Jul. 23, 2010, provisional application No. 61/346,833, filed on May 20, 2010, provisional application No. 61/243,963, filed on Sep. 18, 2009.

(51) Int. Cl.
*G01N 23/00* (2006.01)

(52) U.S. Cl.
USPC ............ 250/311; 250/306; 250/307; 250/310

(58) Field of Classification Search
USPC .................................. 250/306, 307, 310, 311
See application file for complete search history.

(56) References Cited

U.S. PATENT DOCUMENTS

| | | | |
|---|---|---|---|
| 5,270,643 A | 12/1993 | Richardson et al. | |
| 7,154,091 B2 | 12/2006 | Zewail et al. | |
| 7,442,931 B2 | 10/2008 | Zewail et al. | |
| 2002/0109090 A1 | 8/2002 | Nakasuji et al. | |
| 2003/0127593 A1 | 7/2003 | Shinada et al. | |
| 2005/0253069 A1* | 11/2005 | Zewail et al. | 250/311 |
| 2008/0017796 A1 | 1/2008 | Zewail et al. | |
| 2009/0236521 A1 | 9/2009 | Zewail et al. | |

FOREIGN PATENT DOCUMENTS

| | | |
|---|---|---|
| EP | 0570726 A1 | 11/1993 |
| WO | 2001/071579 A2 | 6/2011 |

OTHER PUBLICATIONS

International Search Report and Written Opinion mailed Jun. 24, 2011 in PCT/US2010/049173, 12 pages.

* cited by examiner

*Primary Examiner* — Michael Maskell
(74) *Attorney, Agent, or Firm* — Kilpatrick Townsend & Stockton LLP

(57) ABSTRACT

A method of obtaining PINEM images includes providing femtosecond optical pulse, generating electron pulses, and directing the electron pulses towards a sample. The method also includes overlapping the femtosecond optical pulses and the electron pulses spatially and temporally at the sample and transferring energy from the femtosecond optical pulses to the electron pulses. The method further includes detecting electron pulses having an energy greater than a zero loss value, providing imaging in space and time.

20 Claims, 16 Drawing Sheets

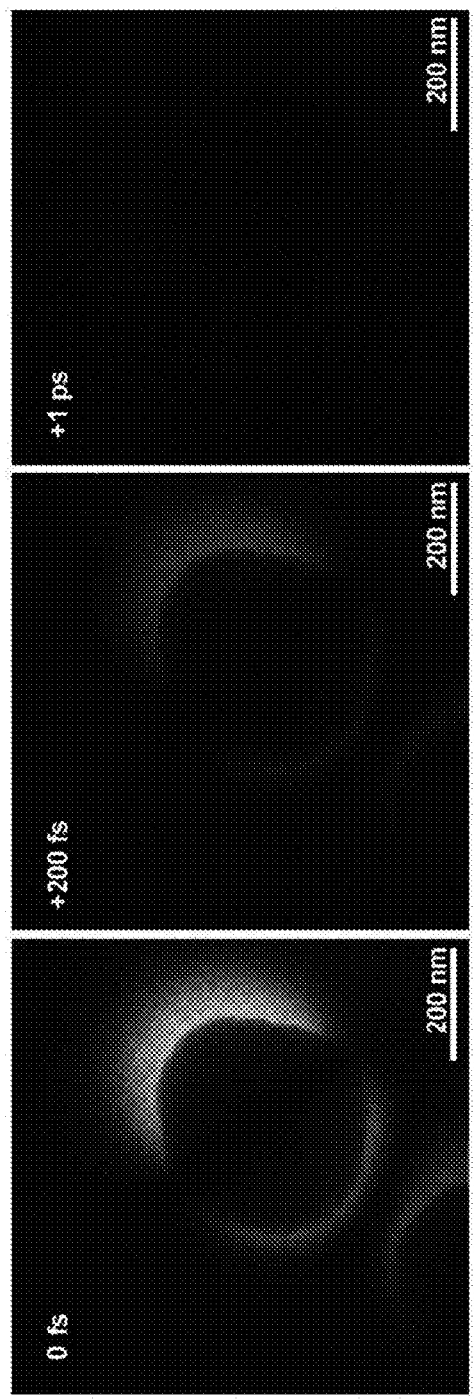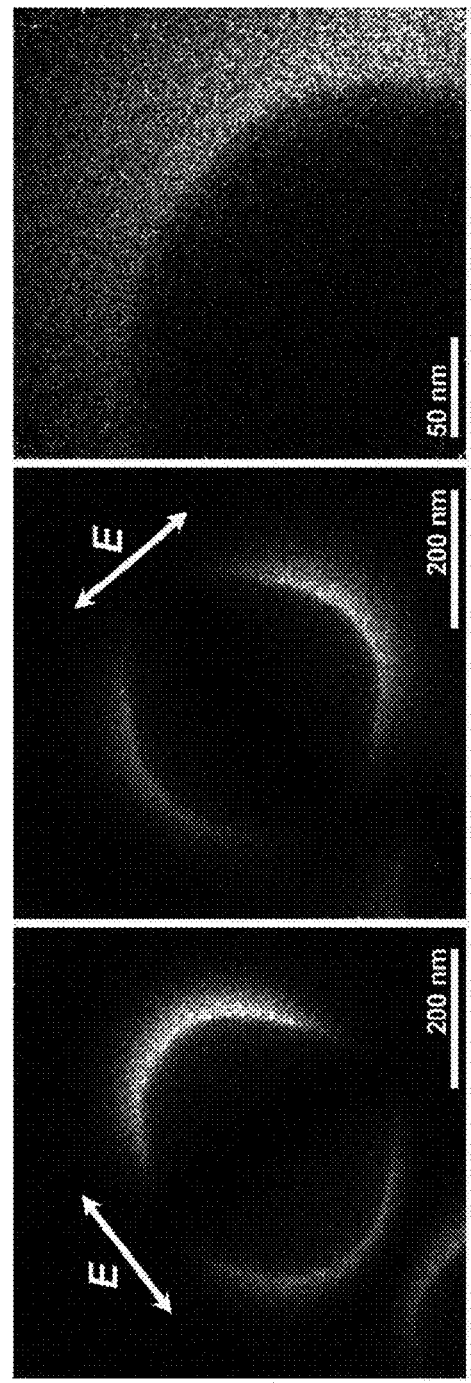
FIG. 8A  FIG. 8B  FIG. 8C
FIG. 8D  FIG. 8E  FIG. 8F

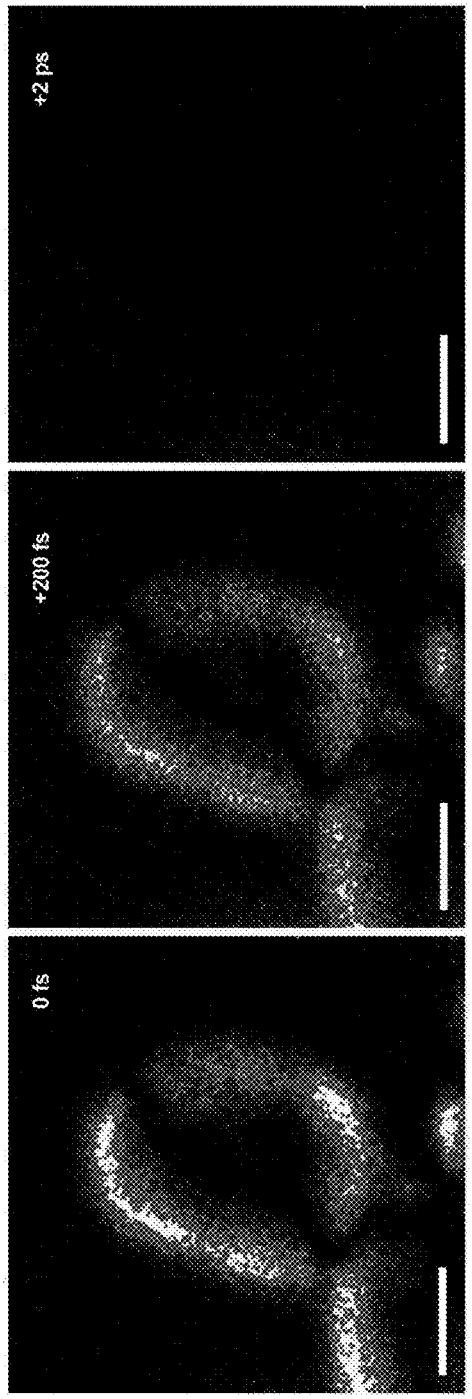
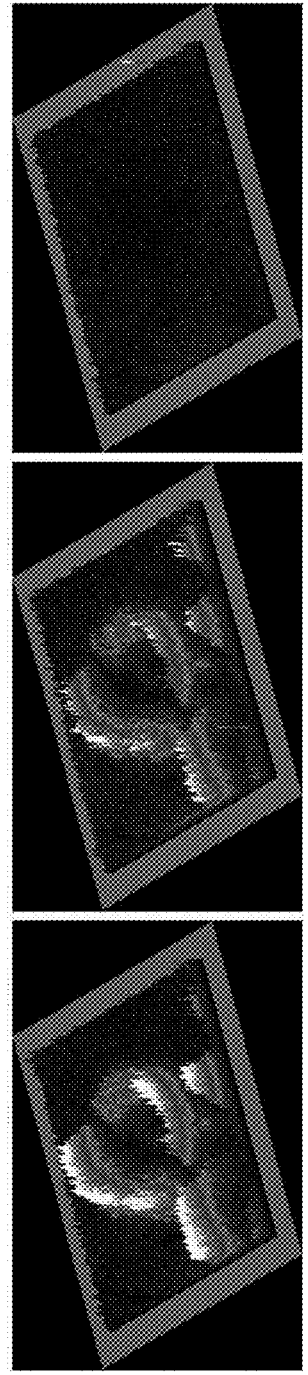
FIG. 10A  FIG. 10B  FIG. 10C
FIG. 10D  FIG. 10E  FIG. 10F

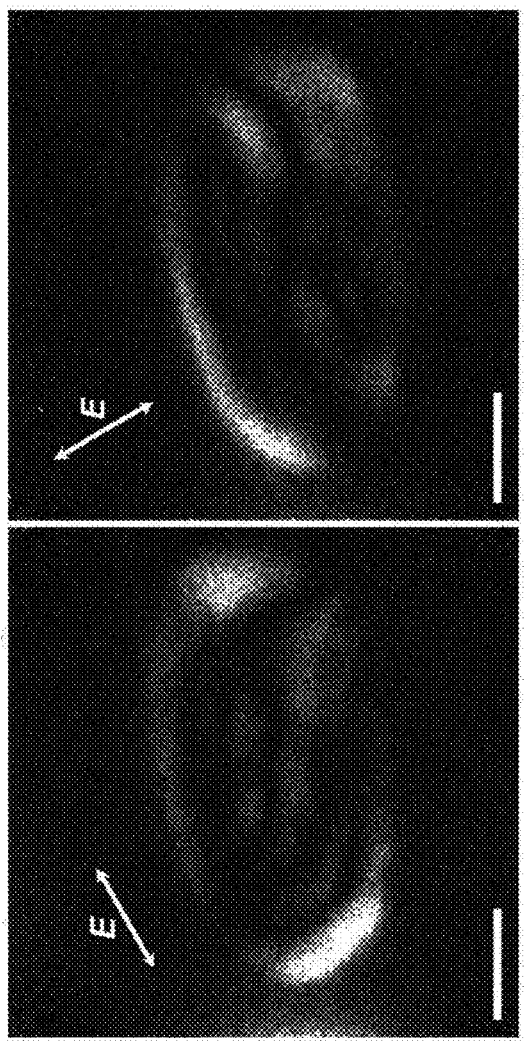
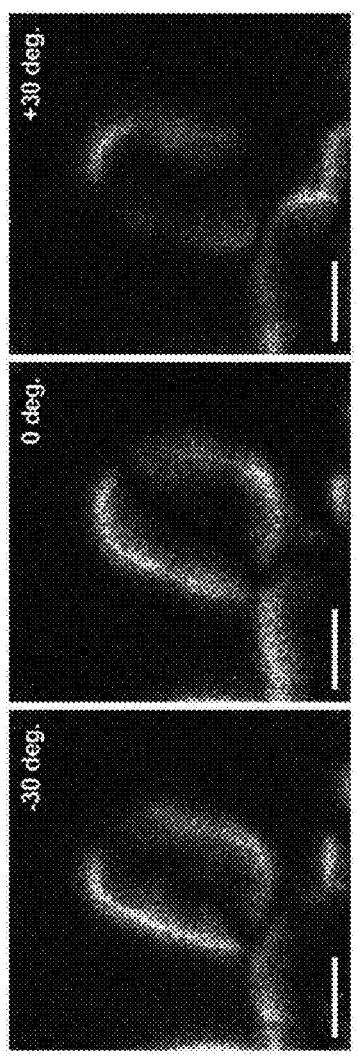
FIG. 11A
FIG. 11B
FIG. 11C
FIG. 11D
FIG. 11E

PHOTON INDUCED NEAR FIELD ELECTRON MICROSCOPE AND BIOLOGICAL IMAGING SYSTEM

CROSS-REFERENCES TO RELATED APPLICATIONS

This application is a continuation of U.S. patent application Ser. No. 12/883,948, filed Sep. 16, 2010, entitled "Photon Induced Near Field Electron Microscope and Biological Imaging System", now U.S. Pat. No. 8,429,761, which claims the benefit of U.S. Provisional Patent Application No. 61/243,963, filed Sep. 18, 2009, entitled "Photon Induced Near-Field Electron Microscopy," U.S. Provisional Patent Application No. 61/346,833, filed May 20, 2010, entitled "Photon Induced Near-Field Electron Microscopy," and U.S. Provisional Patent Application No. 61/367,262, filed Jul. 23, 2010, entitled "Biological Imaging with 4D Ultrafast Microscopy," which are commonly assigned, the disclosures of which are hereby incorporated by reference in their entirety.

STATEMENT AS TO RIGHTS TO INVENTIONS MADE UNDER FEDERALLY SPONSORED RESEARCH OR DEVELOPMENT

The U.S. Government has certain rights in this invention pursuant to Grant No. FA9550-07-1-0484 awarded by the Air Force (AFOSR), Grant Nos. CHE0549936 & DMR0504854 awarded by the National Science Foundation, and Grant No. GM 081520 awarded by National Institutes of Health.

BACKGROUND OF THE INVENTION

In materials science and biology, optical near-field microscopies enable spatial resolutions beyond the diffraction limit, but they cannot provide the atomic-scale imaging capabilities of electron microscopy. Transmission electron microscopy (TEM) is a microscopy technique in which a beam of electrons is transmitted through a specimen. An image is formed from the interaction of the electrons and the specimen on an imaging device, such as a CCD camera. Despite the advances made in TEM techniques, there is a need in the art for improved methods and novel systems for ultrafast electron microscopy.

SUMMARY OF THE INVENTION

According to embodiments of the present invention, methods and systems related to microscopy are provided. In a particular embodiment, methods and systems are provided to provide for photon induced near-field electron microscopy.

According to an embodiment of the present invention, a system for imaging a sample is provided. The system includes a chamber including one or more optical ports, a stage assembly disposed in the chamber and adapted to receive a sample to be imaged, and a femtosecond laser source operable to emit an optical pulse along an optical path. The system also includes a first frequency conversion stage disposed along the optical path and operable to produce a first frequency converted optical pulse and a cathode optically coupled to the first frequency converted optical pulse and operable to emit an electron pulse having a predetermined energy. The system further includes an electron lens assembly operable to direct the electron pulse to impinge on the sample disposed on the stage assembly and a second frequency conversion stage disposed along the optical path and operable to produce a second frequency converted optical pulse characterized by a photon energy. The system additionally includes an optical system operable to receive the second frequency converted optical pulse and direct the second frequency converted optical pulse to impinge on the sample disposed on the stage assembly and a spectral detector operable to capture the electron pulse passing through or near the sample. The electron pulse passing through or near the sample can have an energy higher than the predetermined energy after absorbing energy from the second frequency converted optical pulse. Moreover, the system includes a processor coupled to the detector and an output device coupled to the processor.

According to another embodiment of the present invention, a method of imaging a sample is provided. The method includes providing a first set of femtosecond optical pulses and a second set of femtosecond optical pulses, directing the first set of femtosecond optical pulses to impinge on a cathode, and generating a set of electron pulses in response to the first set of femtosecond pulses. The electron pulses are characterized by a first energy. The method also includes directing the set of electron pulses to impinge on a sample at a first time and directing the second set of femtosecond optical pulses to impinge on the sample at a second time. The difference between the first time and the second time is less than 2 ps. The method further includes transmitting the set of electron pulses through the sample. The set of electron pulses transmitted through the sample is representative of an image of the sample. The method additionally includes detecting the set of electron pulses transmitted through the sample to provide a data signal associated with the image of the sample. An energy of the set of electron pulses transmitted through or near the sample is higher than the first energy after absorbing energy from the second frequency converted optical pulse. Moreover, the method includes transmitting the data signal to an output device.

According to yet another embodiment of the present invention, a method of obtaining PINEM images is provided. The method includes providing femtosecond optical pulses and generating electron pulses. The method also includes directing the electron pulses towards a sample and overlapping the femtosecond optical pulses and the electron pulses spatially and temporally at the sample. The method further includes transferring energy from the femtosecond optical pulses to the electron pulses and detecting electron pulses having an energy greater than a zero loss value.

Numerous benefits are achieved by way of the present invention over conventional techniques. For example, embodiments of the present invention provide methods and systems suitable for measuring samples with nanometer scale spatial resolution and femtosecond scale temporal resolution. Both organic and inorganic samples can be measured using embodiments of the present invention. As described more fully below, embodiments of the present invention utilize energy gain of electrons resulting from temporal and spatial overlap of the electrons with photons at a nanostructure. These and other embodiments of the invention along with many of its advantages and features are described in more detail in conjunction with the text below and attached figures.

BRIEF DESCRIPTION OF THE DRAWINGS

FIGS. 8A-F are ultrafast high-magnification PINEM images of a protein vesicle according to an embodiment of the present invention;

FIGS. 10A-F are ultrafast high-magnification PINEM images of the whole unstained and unfixed *E. coli* cell according to an embodiment of the present invention;

FIGS. 11A-E are ultrafast high-magnification PINEM images of the whole unstained and unfixed *E. coli* cell according to an embodiment of the present invention;

DETAILED DESCRIPTION OF SPECIFIC EMBODIMENTS

Figure 1:
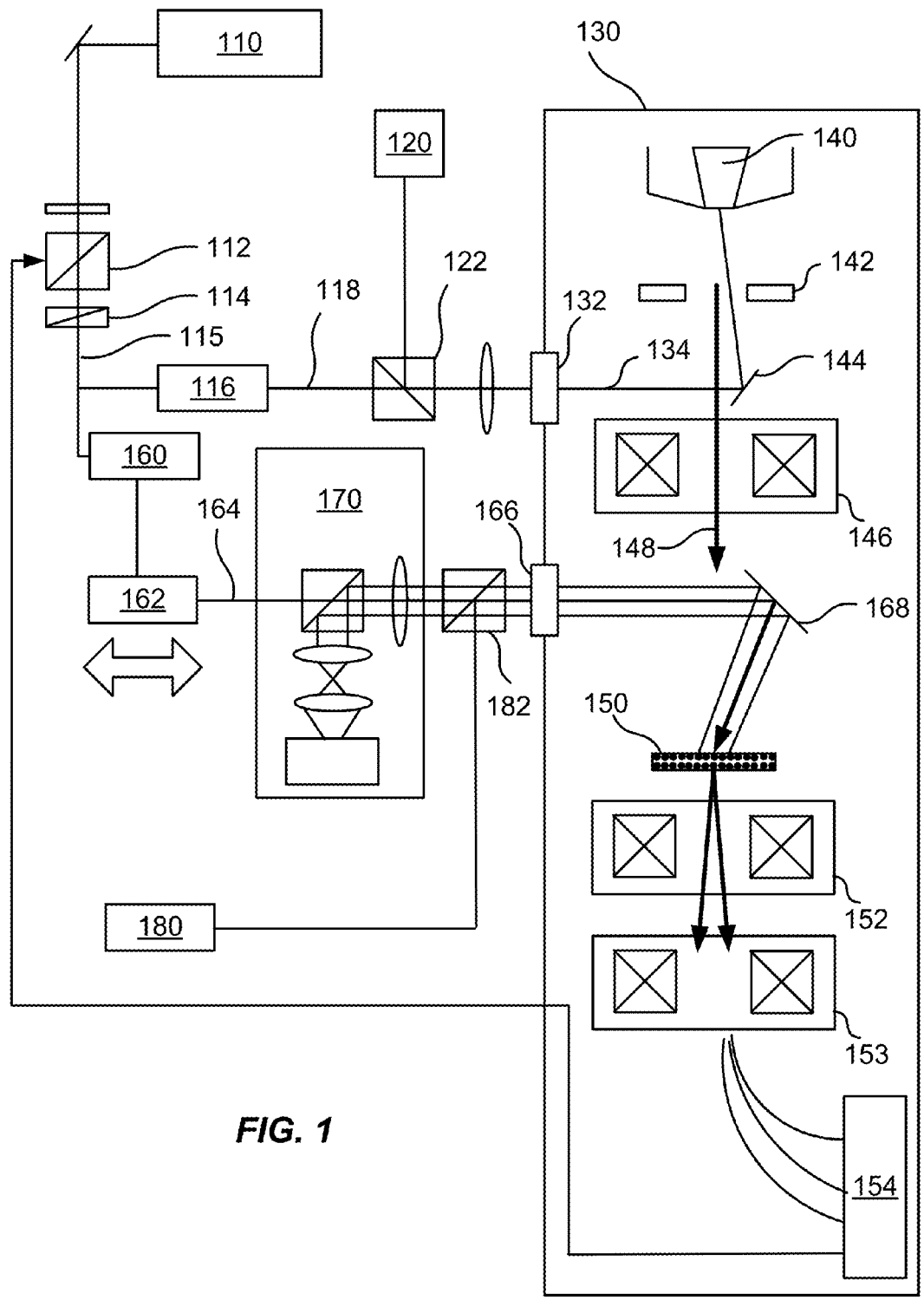
FIG. 1 is a simplified diagram of a photon-induced near-field electron microscope system according to an embodiment of the present invention.

Embodiments of the present invention provide methods and systems for photon-induced near-field electron microscopy (PINEM). In some embodiments of the PINEM technique, the sample (e.g., a biological structure) is exposed to single-electron packets and simultaneously irradiated with femtosecond laser pulses that are coincident with the electron pulses in space and time. By electron energy-filtering those electrons that gain photon energies, the contrast is enhanced only at the surface of the structures involved.

The high-magnification PINEM imaging described herein provides nanometer scale resolution and femtosecond temporal resolution. As described more fully below, PINEM utilizes both photons and electrons in a microscope to provide nanometer spatial and femtosecond temporal resolution with enhanced contrast. This near-field method is selective to fields of structures whose dimensions are orders of magnitude smaller than the diffraction limit of the light and provides unique polarization and temporal features.

Some embodiments of the present invention utilize the filtering of electron energy only in the gain region (i.e., when the electron acquires photon energy) rather than the conventional use of the loss region when the electron gives up its energy to the specimen. Thus, the contrast "lights up" and the femtosecond temporal response is resolved. Because imaging of evanescent fields enhances the contrast, the spatial location of the enhancement can be controlled via laser polarization, time scale, and tomographic tilting. PINEM is applicable to both the imaging of inorganic systems as well as biological systems, despite the differences in intrinsic properties of these systems. Thus, embodiments of the present invention provide methods and systems that are applicable to the imaging of a wide range of both inorganic and organic materials.

According to embodiments of the present invention, discrete electron energy gain and loss processes are utilized in ultrafast electron microscopy. Typically, the passage of an electron through a thin specimen results in the kinetic energy being either conserved (elastic) with only momentum change or reduced (inelastic) through the excitation of the specimen. In electron microscopy, both types of scattered electrons can be used to form an image, the appearance of which depends upon the specific atomic structure and composition of the specimen. In addition, the element-specific electron scattering provides a means to generate a chemical map of the sample region of interest with high resolution. These types of scattering events produce losses of probing electron energies, corresponding to the energies of the atomic core electrons. The so-called "low-loss region" near the (elastic) zero-loss energy pertains to those electrons that have lost only a small amount of kinetic energy, typically because of interactions with valence electrons and bulk and surface plasmons.

According to embodiments of the present invention, and in contrast with the above description involving the energy loss (or no loss) that forms the basis for conventional electron microscopy imaging, the gain of energy by an electron is used to perform imaging. As described more fully throughout the present specification, the gain of energy by the electron as a result of interaction between a femtosecond laser pulse and an ultrashort electron packet that are overlapped in space and time at a nanostructure in situ produces a unique region of energy gain. The interaction between the photon and electron at the nanostructure results in the 200-keV electrons gaining n quanta of photon energy; in other words, the electron absorbs, instead of emitting, the photon energy. Both the absorption and emission of light by the electrons produce peaks in the energy spectrum, and these peaks are located in the gain and loss regions at integer multiples of the photon energy. According to the embodiments described herein, the electrons that have absorbed photons are selected by energy filtering, and an image can be formed that shows precisely where the gain events have occurred. Only electrons that travel near the structure absorb photons, and thus with this filtering in the gain region embodiments reach high resolution in contrast and without interference from background because of contrast of the elastic and loss regions—i.e., an enhancement of the nanoscale contrast.

Given the nature of interactions between electrons and photons, and considering their connections through nanostructures, the inventors have achieved imaging of evanescent electromagnetic fields with electron pulses when such fields are resolved in both space (nanometer and below) and time (femtosecond time scale).

According to embodiments of the present invention, the precise spatiotemporal overlap of femtosecond single-electron packets with intense optical pulses at a nanostructure (e.g., an individual carbon nanotube, a silver nanowire, or the like) results in the direct absorption of integer multiples of photon quanta (n$\hbar\omega$) by the relativistic electrons accelerated to 200 keV. By energy-filtering only those electrons resulting from this absorption, embodiments image directly in space the near-field electric field distribution, obtain the temporal behavior of the field on the femtosecond timescale, and map its spatial polarization dependence. Embodiments of the present invention leverage the observation of the photon-induced near-field effect in ultrafast electron microscopy to provide systems suitable for many applications, including those of direct space-time imaging of localized fields at interfaces and visualization of phenomena related to photonics, plasmonics and nanostructures.

Imaging in conventional electron microscopes is based on elastic interactions of electrons with matter; that is, with no energy loss or gain. With variant techniques, these scattering processes at different angles provide structural and bonding information from images and diffraction patterns. As such, electron energy loss spectroscopy (EELS) is a powerful analytical tool. When images, diffraction, or electron spectra are time-resolved in electron microscopy, photons are typically used to initiate a change for the study of ultrafast structural dynamics that are directly the result of photon-matter interactions, which occur on the femtosecond and longer timescale. But, before these structural changes, electronic distributions are altered, with their dynamical changes being on the femtosecond and shorter timescale and are the direct result of Photon-electron interactions.

In free space, an electron cannot absorb a quantum of electromagnetic energy because of the lack of energy-momentum conservation. However, absorption followed by stimulated emission can occur when two (counter-propagating) photons are used. In fact, an intense standing optical wave can result in momentum transfer to free electrons with scattering rates approaching that of the optical frequency. These photon-electron interactions are basic to attosecond pulse generation and to multi-photon harmonics and the laser-assisted surface photoelectric effect. The inventors have determined that the field can be induced and probed on the ultrashort timescale in order to visualize and control the field for applications in imaging and spectroscopy.

As described more fully throughout the present specification, imaging and spectroscopy methods are provided that rely on the strong interaction between photons and electrons. In some implementations, structural dynamics commence after the photon-induced near-field (PIN) effect diminishes (in some implementations after 400 fs), reducing the ability to perform imaging of the nanostructure electronic properties beyond this time. On this electron-photon interaction timescale, and using intense pulses with peak irradiances of the order of 100 GW/cm$^2$, the 200 keV electron packets lose and gain energy in discrete quanta that are integer multiples of the tuned photon energy. As described more fully throughout the present specification, absorption/emission of at least eight quanta of photon energy can be observed despite the fact that the interaction time with the nanostructure is only a few hundred attoseconds, given the electron speed and path length in the nanostructure. In some implementations, up to 40 or more photons are absorbed by electrons. Thus, the illustration of 8-photon processes are provided merely by way of example and multi-photon processes involving more or less than 8 photons are include within the scope of the present invention. Moreover, by energy-filtering the zero-loss peak (ZLP), embodiments of the present invention provide methods and systems to obtain the images formed as a result of elastic scatterings. In an embodiment that selects only the electrons that have gained quanta of photon energy, the evanescent electric field can be visualized in real space images of the nanostructure. Thus, the field polarization and temporal behavior are different from those of bulk structural transformations.

According to embodiments of the present invention, an individual multiwalled carbon nanotube with a diameter of ~140 nm and a length of ~7 μm (Aldrich, >90% purity) is utilized for imaging. In another embodiment, collections of these multiwalled carbon nanotubes are utilized. In yet another embodiment, silver nanowires with diameters of ~100 nm and lengths ranging from 2 to 20 μm are utilized for imaging. Other nanostructures can be utilized and these examples are not intended to limit the scope of the present invention.

FIG. 1 is a simplified diagram of a PINEM microscope system according to an embodiment of the present invention. This diagram is merely an example, which should not unduly limit the scope of the claims herein. One of ordinary skill in the art would recognize many variations, modifications, and alternatives. The ultra-fast electron microscope illustrated in FIG. 1 can be operated at 200 kV and provides for recording of both femtosecond-resolved electron energy spectra and energy-filtered photon-induced images. In other embodiments, other acceleration voltages are utilized as appropriate to the particular application and the 200 kV operation is merely discussed as an example. As illustrated in FIG. 1, a femtosecond laser 110 is directed through a Pockels cell 112, which acts as a controllable shutter. Although a femtosecond laser 110 is illustrated in FIG. 1, it will be appreciated that the laser 110 can be fiber oscillator/amplifier laser system or the like. The femtosecond laser 110 is configured in one embodiment to output 1,040 nm light of femtosecond pulses. Although a particular output wavelength is described herein, embodiments of the present invention are not limited to this particular wavelength. In some embodiments, the femtosecond laser 110 provides a wavelength tunability function that enables the wavelength of the femtosecond pulses to be modified in order to provide a range of wavelengths as appropriate to the particular sample. In other embodiments, multiple lasers are used to generate the electron generation pulses and/or the clocking signal pulses. One of ordinary skill in the art would recognize many variations, modifications, and alternatives.

A Glan polarizer 114 is used in some embodiments, to select the laser power propagating in optical path 115. A beam splitter (not shown) is used to provide several laser beams to various portions of the system. Although the system illustrated in FIG. 1 is described with respect to imaging applications, this is not generally required by the present invention. One of skill in the art will appreciate that embodiments of the present invention provide systems and methods for imaging, diffraction, crystallography, electron spectroscopy, and related fields. Particularly, the experimental results discussed below yield insight into the varied applications available using embodiments of the present invention.

As described more fully below, the output from a femtosecond laser 110 emitting a train of 220 fs pulses centered at 1,040 nm is split into two arms, one of which is frequency doubled and used to excite the nanostructure, while the other is frequency tripled or quadrupled and used to generate the electron packets at the photocathode source. The femtosecond laser 110 is generally capable of generating a train of optical pulses with predetermined pulse width. One example of such a laser system is a diode-pumped mode-locked titanium sapphire (Ti:Sapphire) laser oscillator operating at 800 nm and generating 100 fs pulses at a repetition rate of 80 MHz and an average power of 1 Watt, resulting in a period between pulses of 12.5 ns. In an embodiment, the spectral bandwidth of the laser pulses is 2.35 nm FWHM. An example of one such laser is a Mai Tai One Box Femtosecond Ti:Sapphire Laser, available from Spectra-Physics Lasers, of Mountain View, Calif. In alternative embodiments, other laser sources generating optical pulses at different wavelengths, with different pulse widths, and at different repetition rates are utilized. One of ordinary skill in the art would recognize many variations, modifications, and alternatives.

A first portion of the output of the femtosecond laser 110 is coupled to a frequency conversion device 116 that frequency doubles, triples, quadruples, or the like, the train of optical pulses to generate a train, in an embodiment, of 400 nm, 100 fs optical pulses at an 80 MHz repetition rate. In the illustrated embodiment, the frequency conversion device is a frequency tripling device, thereby generating an optical pulse at UV wavelengths. In other embodiments, a frequency quadrupling device, or other frequency conversion device is utilized. Of course, the desired output wavelength for the optical pulse will depend on the particular application. The tripled optical pulse produced by the frequency conversion device propagates along electron generating path 118.

A cw diode laser 120 is combined with the frequency tripled optical pulse using beam splitter 122. The light produce by the cw diode laser, now collinear with the optical pulse produced by the SHG device, serves as an alignment marker beam and is used to track the position of the optical pulse train in the electron generating path. The collinear laser beams enter chamber 130 through entrance window 132. In the embodiment illustrated in FIG. 1, the entrance window is fabricated from materials with high transparency at the appropriate wavelength, for example, 400 nm, and sufficient thickness to provide mechanical rigidity. For example, BK-7 glass about 6 mm thick with anti-reflection coatings, e.g. $MgF_2$ or sapphire are used in various embodiments. One of ordinary skill in the art would recognize many variations, modifications, and alternatives.

An optical system, partly provided outside chamber 130 and partly provided inside chamber 130 is used to direct the frequency tripled optical pulse train along the electron-generating path 134 inside the chamber 130 so that the optical pulses impinge on cathode 140. As illustrated, the optical system includes mirror 144, which serves as a turning mirror inside chamber 130. In embodiments of the present invention, polished metal mirrors are utilized inside the chamber 130 since electron irradiation may damage mirror coatings used on some optical mirrors. In a specific embodiment, mirror 144 is fabricated from an aluminum substrate that is diamond turned to produce a mirror surface. In some embodiments, the aluminum mirror is not coated. In other embodiments, other metal mirrors, such as a mirror fabricated from platinum is used as mirror 144.

In an embodiment, the area of interaction on the cathode was selected to be a flat 300 µm in diameter. Moreover, in the embodiment illustrated, the frequency tripled optical pulse was shaped to provide a beam with a beam waist of a predetermined diameter at the surface of the cathode. In a specific embodiment, the beam waist was about 50 µm. In alternative embodiments, the beam waist ranged from about 30 µm to about 200 µm. Of course, the particular dimensions will depend on the particular applications. The frequency tripled optical pulse train was steered inside the chamber using a computer controlled mirror in a specific embodiment.

In a specific embodiment, the optical pulse train is directed toward a front-illuminated photocathode where the irradiation of the cathode by the laser results in the generation of electron pulses via the photoelectric effect. Irradiation of a cathode with light having an energy above the work function of the cathode leads to the ejection of photoelectrons. That is, a pulse of electromagnetic energy above the work function of the cathode ejects a pulse of electrons according to a preferred embodiment. Generally, the cathode is maintained at a temperature of 1000 K, well below the thermal emission threshold temperature of about 1500 K, but this is not required by the present invention. In alternative embodiments, the cathode is maintained at room temperature. In some embodiments, the cathode is adapted to provide an electron pulse of predetermined pulse width. The trajectory of the electrons after emission follows the lens design of the TEM, namely the condenser, the objective, and the projector lenses. Depending upon the embodiment, there may also be other configurations.

In the embodiment illustrated, the cathode is a Mini-Vogel mount single crystal lanthanum hexaboride ($LaB_6$) cathode shaped as a truncated cone with a flat of 300 µm at the apex and a cone angle of 90°, available from Applied Physics Technologies, Inc., of McMinnville, Oreg. As is often known, $LaB_6$ cathodes are regularly used in transmission and scanning electron microscopes. The quantum efficiency of $LaB_6$ cathodes is about $10^{-3}$ and these cathodes are capable of producing electron pulses with temporal pulse widths on the order of $10^{-13}$ seconds. In some embodiments, the brightness of electron pulses produced by the cathode is on the order of $10^9$ $A/cm^2/rad^2$ and the energy spread of the electron pulses is on the order of 0.1 eV. In other embodiments, the pulse energy of the laser pulse is reduced to about 500 pJ per pulse, resulting in approximately one electron/pulse Generally, the image quality acquired using a TEM is proportional to the number of electrons passing through the sample. That is, as the number of electrons passing through the sample is increased, the image quality increases. Some pulsed lasers, such as some Q-switched lasers, reduce the pulse count to produce a smaller number of pulses characterized by higher peak power per pulse. Thus, some laser amplifiers operate at a 1 kHz repetition rate, producing pulses with energies ranging from about 1 µJ to about 2 mJ per pulse. However, when such high peak power lasers are used to generate electron pulses using the photoelectric effect, among other issues, both spatial and temporal broadening of the electron pulses adversely impact the pulse width of the electron pulse or packet produced. In some embodiments of the present invention, the laser is operated to produce low power pulses at higher repetition rates, for example, 80 MHz. In this mode of operation, benefits available using lower power per pulse are provided, as described below. Additionally, because of the high repetition rate, sufficient numbers of electrons are available to acquire high quality images.

In some embodiments of the present invention, the laser power is maintained at a level of less than 500 pJ per pulse to prevent damage to the photocathode. As a benefit, the robustness of the photoemitter is enhanced. Additionally, laser pulses at these power levels prevent space-charge broadening of the electron pulse width during the flight time from the cathode to the sample, thus preserving the desired femtosecond temporal resolution. Additionally, the low electron count per pulse provided by some embodiments of the present invention (e.g., a single electron) reduces the effects of space charge repulsion in the electron pulse, thereby enhancing the focusing properties of the system. As one of skill in the art will appreciated, a low electron count per pulse, coupled with a high repetition rate of up to 80 MHz provided by the femtosecond laser, provides a total dose as high as one electron/Å$^2$ as generally utilized in imaging applications.

In alternative embodiments, other suitable cathodes capable of providing a ultrafast pulse of electrons in response to an ultrafast optical pulse of appropriate wavelength are utilized. In embodiments of the present invention, the cathode is selected to provide a work function correlated with the wavelength of the optical pulses provided by the SHG device. The wavelength of radiation is related to the energy of the photon by the familiar relation $\lambda(\mu m) \approx 1.24 \div h\nu$ (eV), where $\lambda$ is the wavelength in microns and hν is the energy in eV. For example, a LaB$_6$ cathode with a work function of 2.7 eV is matched to optical pulses with a wavelength of 400 nm (ν=3.1 eV) in an embodiment of the present invention. As illustrated, the cathode is enclosed in a vacuum chamber 130, for example, a housing for a transmission electron microscope (TEM). In general, the vacuum in the chamber 130 is maintained at a level of less than $1 \times 10^{-6}$ torr. In alternative embodiments, the vacuum level varies from about $1 \times 10^{-6}$ torr to about $1 \times 10^{-10}$ torr. The particular vacuum level will be a function of the varied applications.

In embodiments of the present invention, the short duration of the photon pulse leads to ejection of photoelectrons before an appreciable amount of the deposited energy is transferred to the lattice of the cathode. In general, the characteristic time for thermalization of the deposited energy in metals is below a few picoseconds, thus no heating of the cathode takes place using embodiments of the present invention.

Electrons produced by the cathode 140 are accelerated past the anode 142 and are collimated and focused by electron lens assembly 146 and directed along electron imaging path 148 toward the sample 150. The electron lens assembly generally contains a number of electromagnetic lenses, apertures, and other elements as will be appreciated by one of skill in the art. Electron lens assemblies suitable for embodiments of the present invention are often used in TEMs. The electron pulse propagating along electron imaging path 148 is controlled in embodiments of the present invention by a controller (not shown, but described in more detail with reference to certain Figures below) to provide an electron beam of predetermined dimensions, the electron beam comprising a train of ultrafast electron pulses.

The relationship between the electron wavelength ($\lambda_{deBroglie}$) and the accelerating voltage (U) in an electron microscope is given by the relationship $\lambda_{deBroglie} = h/(2 m_0 eU)^{1/2}$, where h, m$_0$, e are Planck's constant, the electron mass, and an elementary charge. As an example, the de Broglie wavelength of an electron pulse at 120 kV corresponds to 0.0335 Å, and can be varied depending on the particular application. The bandwidth or energy spread of an electron packet is a function of the photoelectric process and bandwidth of the optical pulse used to generate the electron packet or pulse.

Electrons passing through the sample or specimen 150 are focused and spatially separated as a function of energy by electron lens assembly 152 onto a detector 154, which can include a Gatan Imaging Filter. Although FIG. 1 illustrates two electron lens assemblies 146 and 152, the present invention is not limited to this arrangement and can have other lens assemblies or lens assembly configurations. In alternative embodiments, additional electromagnets, apertures, other elements, and the like are utilized to focus the electron beam either prior to or after interaction with the sample, or both.

Detection of electrons passing through the sample, including single-electron detection, is achieved in one particular embodiment through the use of an ultrahigh sensitivity (UHS) phosphor scintillator detector 154 especially suitable for low-dose applications in conjunction with a digital CCD camera. In a specific embodiment, the CCD camera was an UltraScan™ 1000 UHS camera, manufactured by Gatan, Inc., of Pleasanton, Calif. The UltraScan™ 1000 CCD camera is a 4 mega-pixel (2048×2048) camera with a pixel size of 14 μm×14 μm, 16-bit digitization, and a readout speed of 4 Mpixels/sec. In order to reduce the noise and picture artifacts, in some embodiments, the CCD camera chip is thermoelectrically cooled using a Peltier cooler to a temperature of about −25° C. The images from the CCD camera were obtained with DigitalMicrograph™ software embedded in the Tecnai™ user interface, available from FEI of Hillsboro, Oreg. Of course, there can be other variations to the CCD camera, cooler, and computer software, depending upon the embodiment.

In order to reduce or eliminate space-charge effects, the system illustrated in FIG. 1 can be operated in the single-electron regime (0.1-1 electrons per packet at the detector). Typical parameters during operation are a repetition rate of 500 kHz, a fluence of 14 mJ/cm$^2$ for carbon nanotubes, and a fluence of 1.2 mJ/cm$^2$ for silver nanowires. A portion of the beam from femtosecond laser 110 is frequency doubled using frequency doubler 160 to produce a frequency doubled beam 164. The doubled beam passes through an optical delay line 162, enters chamber 130 through entrance window 166, and reflects off mirror 168 to impinge on sample 150. The time delay (on the femtosecond scale) between the frequency tripled beam (and thus the electron packet) and the frequency doubled beam is controlled by a controller (not shown). Optical imaging system 170 provides for alignment of the beams and viewing of the sample on the stage.

In order to initiate dynamic changes in the sample, a clocking pulse laser 180 is provided. Clocking pulses from the clocking pulse laser 180 are coupled into the chamber using a beam splitter 182 or other suitable optical element. The clocking pulse can serve to initiate a dynamic change in the sample and delay of the clocking pulse enables the measurements using the overlapping electron and photon pulses to be made of samples during the period of dynamic change.

In one implementation, the repetition rate of the femtosecond laser was varied between 1.4 and 1.55 MHz. PINEM cell images described below were acquired with a specimen excitation fluence of 1.3 mJ/cm$^2$ (50 μm FWHM), and electron energy gain/loss spectra and PINEM images of the protein vesicle were obtained with an excitation fluence of 5.4 mJ/cm². As described more fully throughout the present specification, images obtained using some embodiments of the present invention are generated by energy filtering and using only the gain region of the spectrum. After locating the maximum spatiotemporal overlap of the femtosecond laser pulse and electron packets at the specimen, energy-filtered images are provided by setting a slit width of 10 eV and sequentially stepping the spectrum offset by 1-eV increments until only the gain region is selected (i.e., no part of the ZLP or loss region contributes to the energy-filtered images). The ZLP intensity as a function of the delay time provides the temporal response; given the response time of the dielectric protein shell and the optical pulse width (~250 fs), the observed response with σ=280±13 fs conclusively indicate the femtosecond nature of the electron pulse and the ultrashort response provided by embodiments of the present invention.

Figure 2A:
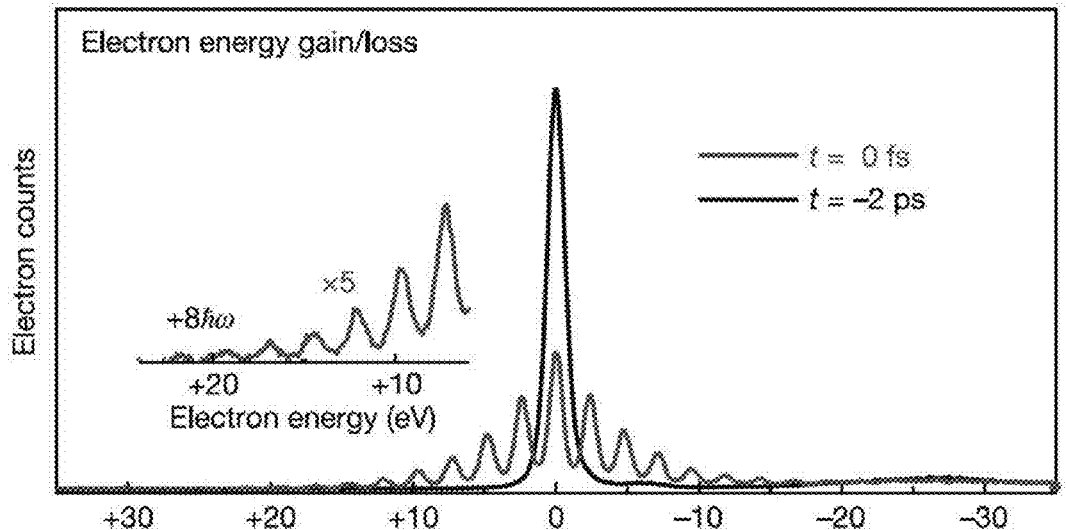
FIG. 2A is a plot illustrating temporally resolved electron energy spectra of carbon nanotubes irradiated with an intense femtosecond laser pulse at two different delay times according to an embodiment of the present invention.

FIG. 2A is a plot illustrating temporally resolved electron energy spectra of carbon nanotubes irradiated with an intense femtosecond laser pulse at two different delay times according to an embodiment of the present invention. Referring to FIG. 2A, the zero-loss peak (ZLP) of the 200 keV electrons (t=−2 ps curve) is taken when the electron packet arrives before the femtosecond pulse. In this spectrum only the plasmon peaks are present.

The second curve (t=0 fs curve) was recorded when the electron and photon pulses were configured for a maximum overlap. The energy spectrum at coincidence of the two pulses (t=0 fs curve) displays different peaks associated with multiple quanta of photon absorption/emission on both the lower-energy and higher-energy sides of the ZLP. The inset illustrated in FIG. 2A shows the positive energy gain region multiplied by 5 for the t=0 spectrum, indicating that absorption of at least eight quanta of photon energy can be observed at maximum spatiotemporal overlap. Embodiments are not limited to eight quanta of photon energy and larger numbers (e.g., up to and exceeding 40 quanta of photon energy) are included within the scope of the present invention. For the t=−2 ps spectrum, however, the discrete peaks are absent and only the π and π+σ plasmon peaks at 6 and 25 eV, respectively, are observed.

Figure 2B:
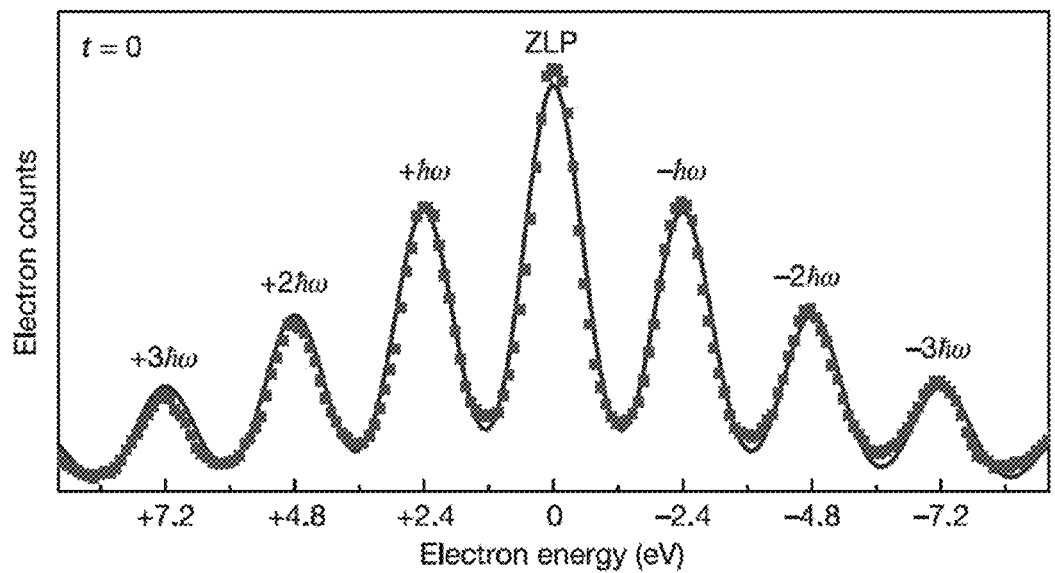
FIG. 2B is a plot showing a magnified view of the electron energy spectrum obtained at t=0 illustrated in FIG. 2A.

FIG. 2B is a plot showing a magnified view of the electron energy spectrum obtained at t=0 fs illustrated in FIG. 2A. The magnified view of the electron spectrum illustrated in FIG. 2B reveals that the discrete peaks on both sides of the ZLP occur at integer multiples of the photon energy of the exciting femtosecond pulse (i.e., 2.4 eV in FIG. 2B). From these spectra, it is apparent that the discrete peaks occur as a consequence of the interaction of the 200 keV ultra-fast electron packet with the 2.4 eV femtosecond photon pulse. On this timescale, the large influence of the PIN effect is illustrated by the substantial decrease in the ZLP intensity at maximum overlap. From the recorded electron-energy spectra, it was determined that electrons of the ultrafast packets can absorb more than eight photons during the brief interaction with the nanostructure as shown by the inset in FIG. 2A. It is important to note that the spectra shown in FIG. 2A and FIG. 2B (loss/gain) are observed only in the presence of the nanostructure. The energy is given in reference to the loss/gain of photon quanta by the electrons with respect to the zero-loss energy. The energy gain peaks illustrated in FIG. 2B (i.e., to the left of ZLP) can be measured individually or in one or more groups. As an example, a different image could be formed using each of the energy gain peaks, an image could be formed using all of the energy gain peaks, or some combinations of subsets of the energy gain peaks could be used. One of ordinary skill in the art would recognize many variations, modifications, and alternatives. In some embodiments, the energy gain peaks are characterized by a spectral narrowing as a function of electron energy. In some images, filtering of the higher energy peaks may result in sharper images as a result. Additionally, as a function of time, the different energy gain peaks may vary in intensity, resulting in images for the individual peak or combinations of the peaks that vary as a function of time.

On the length scale (d) of the nanostructure, relative to that of the photon (wavelength λ), the interaction between photons and electrons (that is, free-free transitions) is greatly enhanced by the evanescent field that is created through the excitations of the carbon nanotube, and similarly for the silver nanowires, without which energy-momentum conservation is not achieved. The probability of electron-photon coupling in the presence of a third body (for example, atom, molecule, or a surface) increases as the electron energy increases for a fixed laser intensity and wavelength, and such a characteristic is ideal for the ultrafast electron microscope operated at 200 keV. Free-free transitions in the electron continuum, without perturbations from the third body, become descriptive of the process when the electron has a much higher energy than the photon. Whereas plasmonic fields induced by the femtosecond pulse can follow the laser electric field, the relaxation time for metallic nanoparticles is of the order of tens to hundreds of femtoseconds, depending on the damping (recombination) processes involved. Multiwalled carbon nanotubes are metallic in nature, as are silver nanowires, and for such metallic nanostructures absorption is enhanced at lower energies.

Figure 3A:
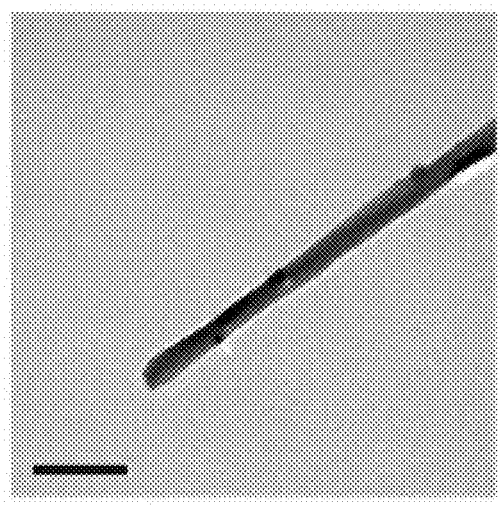
FIG. 3A is a bright-field image of an individual carbon nanotube obtained using photon-induced near-field microscopy according to an embodiment of the present invention.

FIG. 3A is a bright-field image of an individual carbon nanotube obtained using photon-induced near-field microscopy according to an embodiment of the present invention. The photon-induced near-field electron microscope image of the individual nanotube illustrated in FIG. 3A is a bright-field image shown for reference (time-averaged, unfiltered). The average diameter across the tube is 147±20 nm and the scale bar is 500 nm. As illustrated in FIG. 3A, embodiments of the present invention enable imaging of single structures, such as a single particle, a single protein, or the like.

Figure 3B:
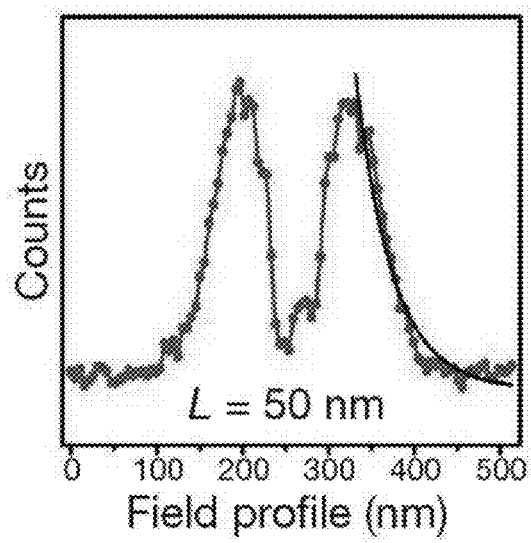
FIG. 3B is a plot illustrating the spatial field gradient (of length scale L) in image counts according to an embodiment of the present invention.
Figure 3C:
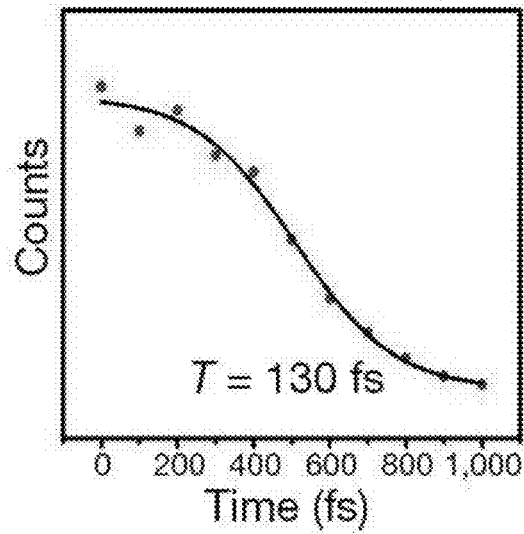
FIG. 3C is a plot of the decay of counts with time according to an embodiment of the present invention.

FIG. 3B is a plot illustrating the spatial field gradient (of length scale L) in image counts according to an embodiment of the present invention. The profile illustrated in FIG. 3B was obtained from the t=0 frame. The exponential curve on the right side of the plot is displayed to illustrate the typical length scale of an evanescent field. FIG. 3C is a plot of the decay of counts with time according to an embodiment of the present invention.

Figure 3D:
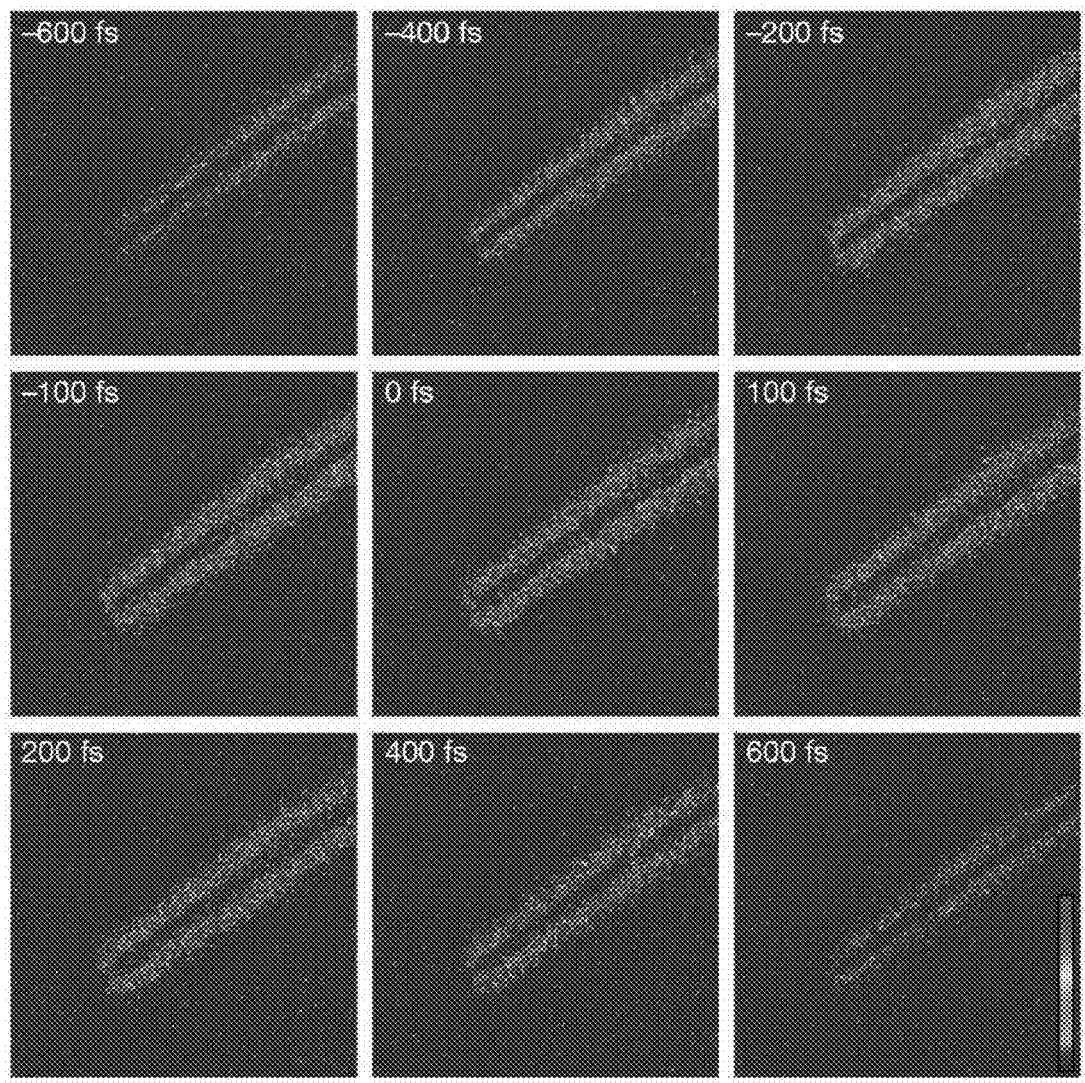
FIG. 3D shows a series of nine energy-filtered images according to an embodiment of the present invention.

FIG. 3D shows a series of nine energy-filtered images according to an embodiment of the present invention. The nine energy-filtered images were acquired by using only the electrons that have gained energy (up to n=4) relative to the ZLP. For additional clarity, the images can be displayed in false color (see bar at lower right). Darker colors indicates regions of the CCD where no counts were recorded because we selected only the +nℏω region. The time of arrival of the electron packet at the nanotube relative to the clocking laser pulse is shown in the upper left corner of each image. The electric field of the clocking laser pulse was linearly polarized perpendicular to the long-axis of the nanotube. The counts are shown by a brighter intensity in FIG. 3D and represent the fields created by the femtosecond pulse around the surface of the nanostructure and their decay with time.

In FIG. 3D, the effect of energy-filtering on imaging is displayed at different times. By using an energy filter (n=1 to 4; 10 eV total width) to select only those electrons that have absorbed energy to form an image, the evanescent field generated by the femtosecond excitation pulse became evident in real-space images of the isolated (individual) nanotube. Further, by varying the arrival time of the electron packet at the carbon nanotube relative to the femtosecond optical pulse, the ultrafast evolution of the evanescent field was followed in real time. As can be seen in FIG. 3D, image counts appear only within the local vicinity of the surface of the carbon nanotube; no energy gain occurs far from the nanostructure or within the tube itself.

The energy-filtered image generated by selecting only energy-gained electrons and obtained at t=−600 fs shows almost no counts. As the temporal overlap increases, however, the counts due to the evanescent optical field increases and reaches a maximum at t=0 (that is, maximum overlap) before decreasing again to almost zero at t=+600 fs. In addition to revealing the rise time of the evanescent field to be much less than one picosecond, the sequence of images in FIG. 3D also shows that the field extends at the interface to ~50 nm (1/e) into vacuum on either side of the nanotube. The image length scale is consistent with theoretical considerations of optically excited plasmons. The time necessary for the image counts to decay from the maximum to minimum values, normalized by the maximum change in counts per unit time as shown in FIG. 3C is 130 fs, reflecting the rate of change, as discussed below.

Figure 4A:
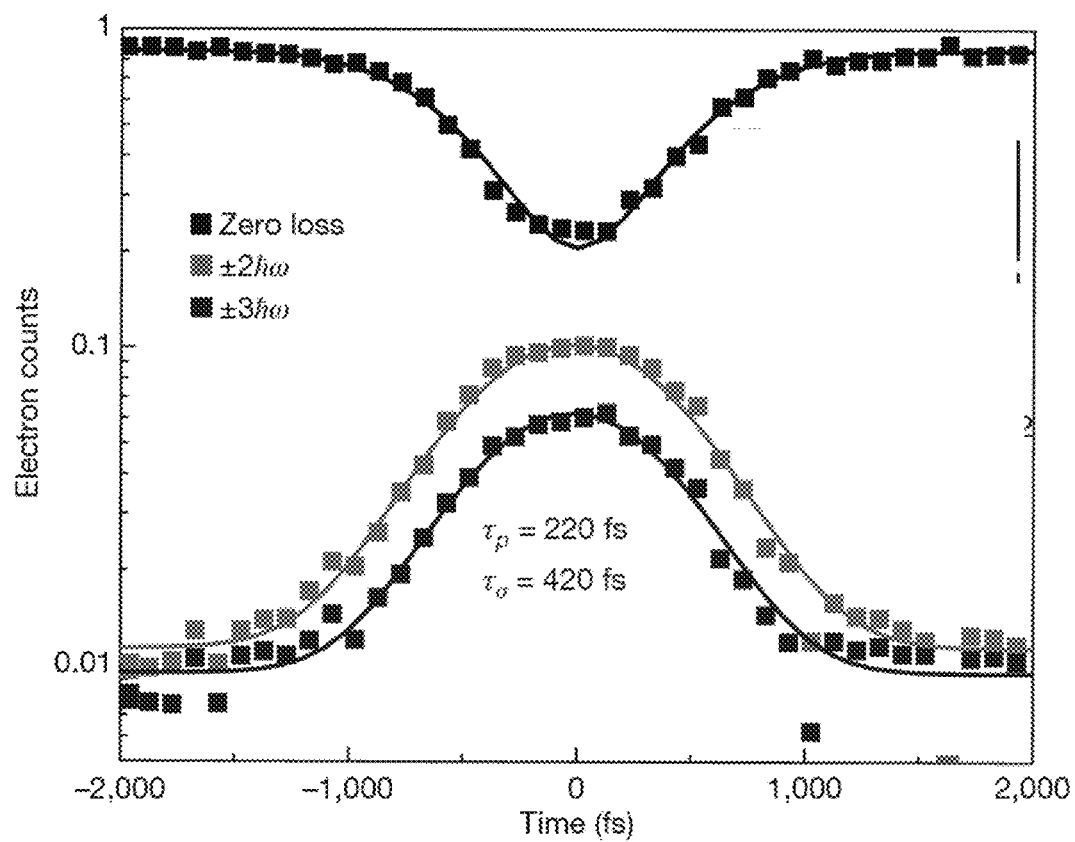
FIG. 4A shows plots of the temporal response of the imaged interfacial fields according to an embodiment of the present invention.

FIG. 4A shows plots of the temporal response and polarization dependence of the imaged interfacial fields according to an embodiment of the present invention. In FIG. 4A, the temporal dependence of the ZLP and representative peaks of $\pm n\hbar\omega$ are plotted on a log scale. Inserted into the plot are the values for $\tau_p$ of the femtosecond optical pulse (220 fs) and $\tau_o$ of the fitted transient (420 fs). The t=0 position is determined by the temporal response of the ZLP. The inset in FIG. 4A illustrates a linear contour plot of the data fitted by the Gaussians.

Figures 5A, 5B, 5C:
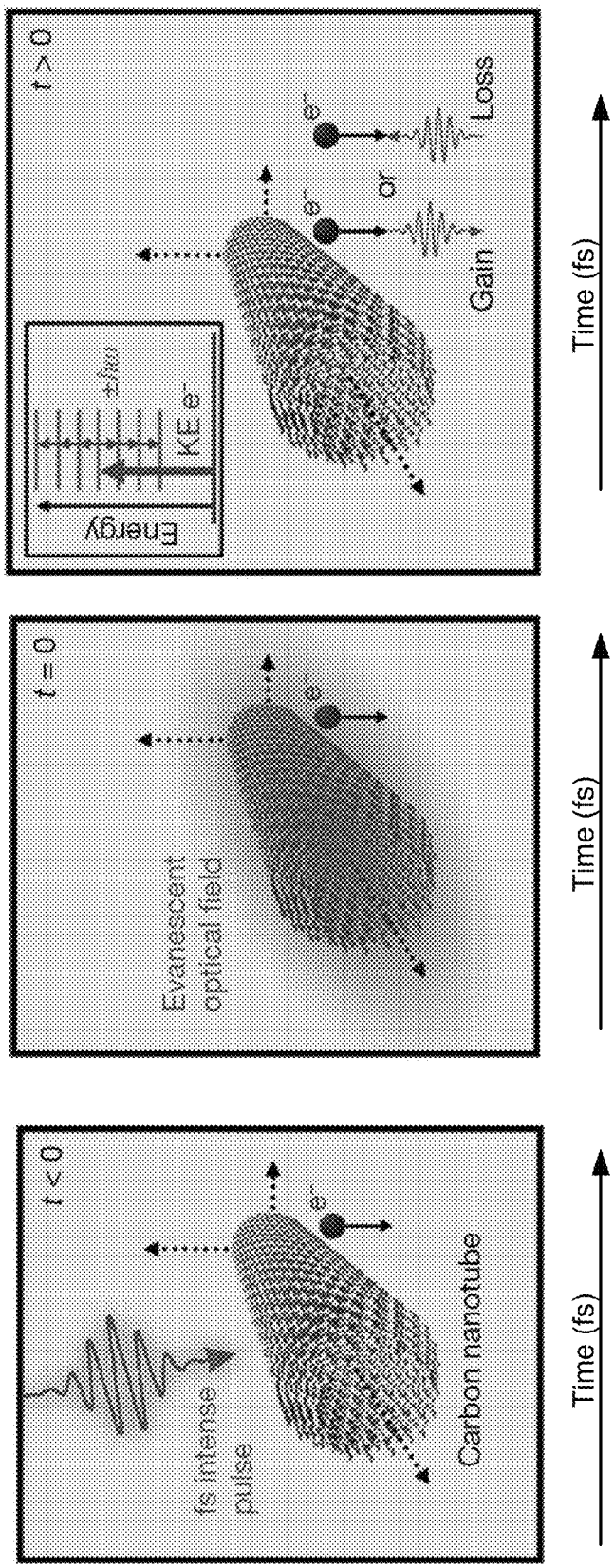
FIG. 5A is a simplified physical depiction of the interaction between the electron, photon, and evanescent field when the electron packet arrives at the nanotube before the femtosecond laser pulse (t<0) according to an embodiment of the present invention.
FIG. 5B is a simplified physical depiction of the interaction between the electron, photon, and evanescent field at the precise moment at t=0 when the electron packet, femtosecond laser pulse, and evanescent field are at maximum overlap at the carbon nanotube according to an embodiment of the present invention.
FIG. 5C is a simplified physical depiction of the interaction between the electron, photon, and evanescent field during and immediately after the interaction (t>0) when the electron gains/loses energy equal to integer multiples of femtosecond laser photons according to an embodiment of the present invention.

The ultrafast response shown in the discrete energy gain and loss (that is, bands on both sides of the ZLP (see FIGS. 3A-3D)) can be quantified in energy and time space as illustrated in FIGS. 5A-5C. In order to obtain the intensity profile, each energy spectrum was fitted to a series of Gaussians having the form:

$$S(E) = \frac{1-2\alpha}{\sqrt{2\pi\sigma^2}}e^{-E^2/2\sigma^2} + \sum_{\pm n}\frac{an}{\sqrt{2\pi\sigma^2}}e^{-E^2/2\sigma^2} \quad (1)$$

where $\alpha$ is a sum over $a_n$, the amplitude of the $n^{th}$ photon process, and $\sigma$ reflects the energy width. A typical fit of equation (1), which has also been invoked in photoelectron studies, to the observed spectrum is shown in FIG. 2B. In FIG. 4A, the temporal dependence of different sidebands and the ZLP is plotted on a log scale. With Gaussian analysis in the time domain, we obtained the time constants involved. For the $\pm 3\hbar\omega$ peaks, $\tau_o$=420 fs, which is a direct result of the convolution of the femtosecond excitation pulse, the electron packet, and response time of the evanescent optical field; the femtosecond optical pulse duration $\tau_p$=220 fs and energy-filtering may be significant in reducing electron pulse energy dispersion. All peaks were fitted similarly, giving the range of $\tau_o$ to be 510±90 fs. Because of the geometry involving the two pulses used in the ultrafast electron microscope used to collect the data illustrated herein, the (axial) group velocity mismatch is irrelevant here, as it results in a dispersion of ~1 fs over the 100 nm path length. The zero loss curve is the top curve in FIG. 4A, the $\pm 2\hbar\omega$ curve is the middle curve, and the $\pm 3\hbar\omega$ curve is the bottom curve.

Figure 4B:
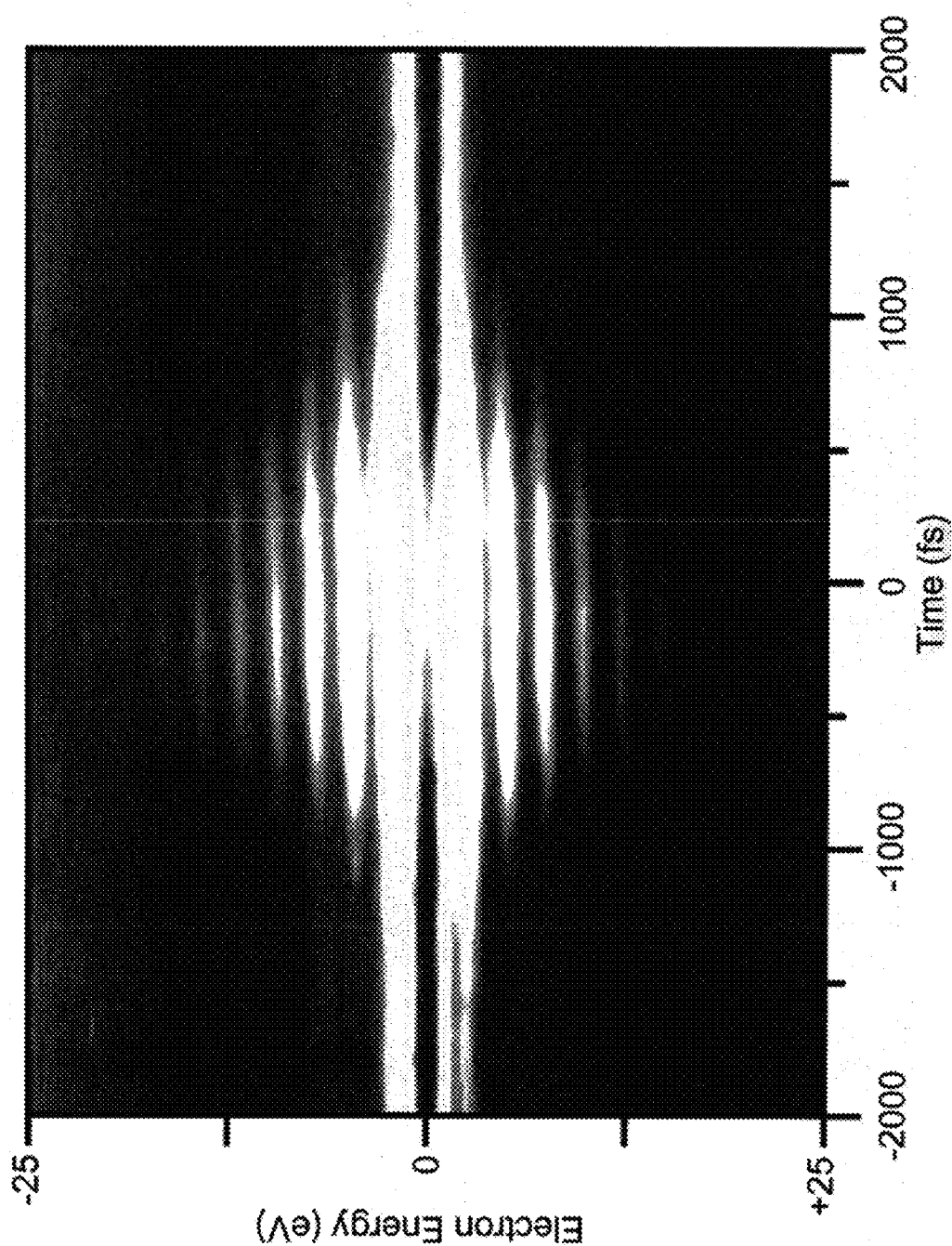
FIG. 4B shows of contour plot of electron counts as a function of electron energy and time between the electron and photon pulses according to an embodiment of the present invention.

FIG. 4B shows a contour plot of electron counts as a function of electron energy and time between the electron and photon pulses according to an embodiment of the present invention. Referring to FIG. 4B, the ZLP is characterized by a decreased electron count due to energy absorption and emission in the vicinity of the nanostructure. The electron count is periodic as a result of the different number of quanta of photon energy. As the time between the impingement of electron pulse and the photon pulse increases, the signal drops off. As the time increases to several picoseconds, the interaction between the evanescent wave of the photon and the electrons decreases as illustrated in the figure as the temporal overlap between the femtosecond optical pulse and the electron pulse decreases.

Figure 4D:
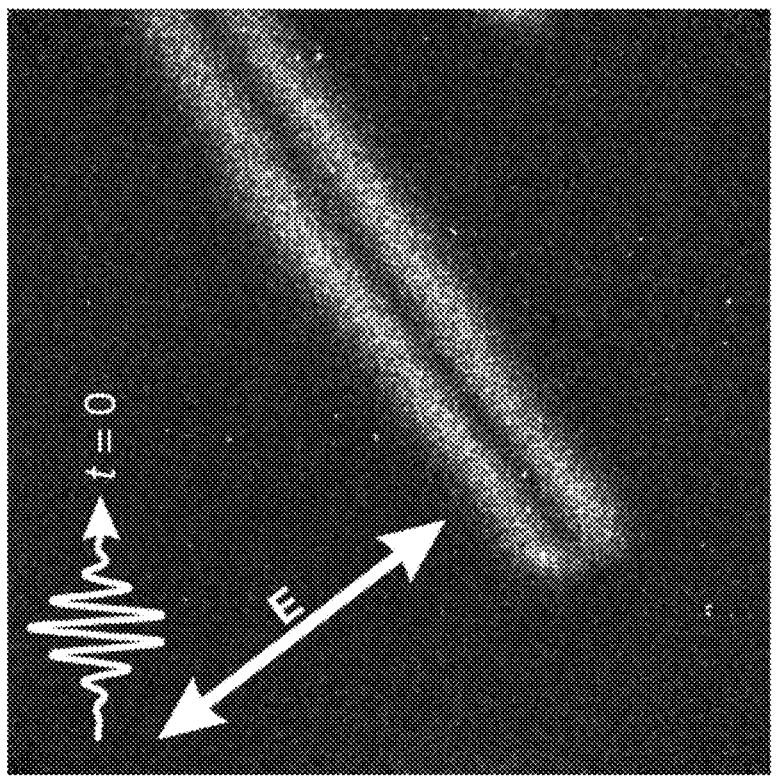
FIG. 4D is an image taken when the E-field polarization of the femtosecond laser pulse is perpendicular to the long-axis of the nanotube.
Figure 4C:
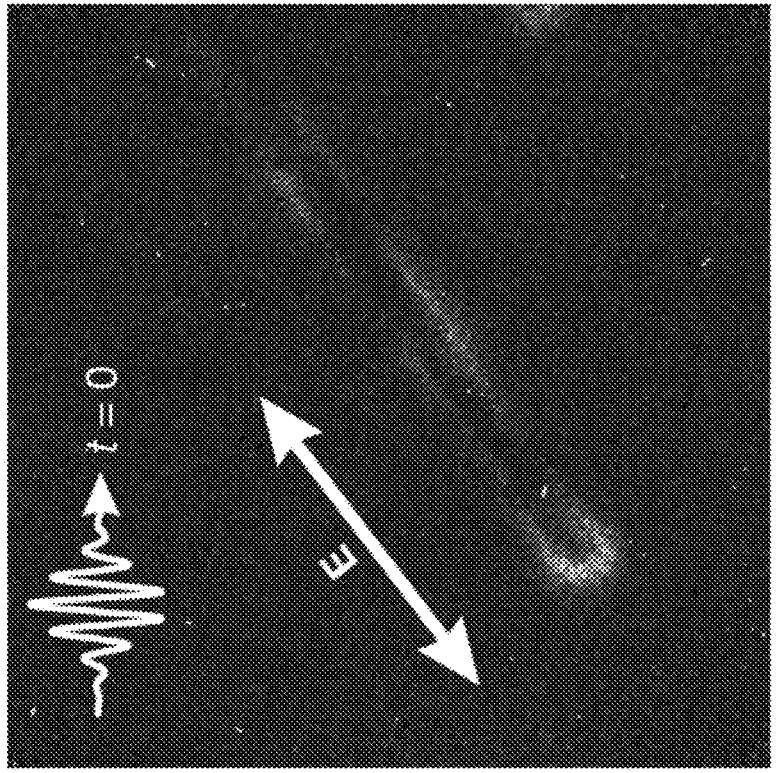
FIG. 4C is an image taken when the E-field polarization of the femtosecond laser pulse is parallel to the long-axis of the nanotube.

FIG. 4C is an image taken when the E-field polarization of the femtosecond laser pulse is parallel to the long-axis of the nanotube. The center of the nanotube is characterized by a low intensity. FIG. 4D is an image taken when the E-field polarization of the femtosecond laser pulse is perpendicular to the long-axis of the nanotube. Both polarization frames were taken at t=0, when the interaction between electron, photons and the evanescent field is at a maximum.

Besides the temporal and energy domain observations, we also examined the spatial distribution of the near field from images taken for different polarizations of the femtosecond pulse relative to the orientation of an individual nanotube (or wire). As illustrated in FIGS. 4C and 4D, ultrafast electron microscope images were obtained at t=0 with the E-field of the femtosecond laser pulse polarized either parallel (FIG. 4C) or perpendicular (FIG. 4D) to the long axis of the carbon nanotube. These frames display striking changes in the images: when the laser polarization is positioned appropriately relative to the nanotube orientation, a spatial enhancement of the evanescent field is observed in the images. This is because for this case the confinement is in the regime of $d<\lambda$. On the other hand, for the other polarization, when $d>\lambda$, the tip enhancement is seen when the polarization changes by 90°. For this case, certain spatial modes may be formed with unique distributions. The precise distribution of the field is dependent upon the nanoscale geometry of the specimen, and the fact that the apex of the tip has a decrease in counts at perpendicular polarization is consistent with nanometer-scale field calculations.

In addition to analysis of carbon nanotubes, embodiments of the present invention are applicable to the analysis of other structures including silver nanowires. The inventors have demonstrated that for silver nanowires, similar filtered energy gain images are obtained along with the electron spectra and the polarization dependence. The irradiance utilized to obtain the images was, however, an order of magnitude lower (10 $GW/cm^2$), consistent with the stronger near-field formed in the metallic nanowire and with the difference in material property. The polarization dependence was the same as that of the carbon nanotubes, owing to the similarity of the geometrical structure of the nanotubes and nanowires.

From the above described results, and without limiting embodiments of the present invention, PINEM imaging can be illustrated by considering the spatiotemporal coordinates of the three bodies involved. FIG. 5A is a simplified physical depiction of the interaction between the electron, photon, and evanescent field when the electron packet arrives at the nanotube before the femtosecond laser pulse (t<0) according to an embodiment of the present invention. In the case illustrated in FIG. 5A no spatiotemporal overlap has yet occurred. At negative times (t<0), we can visualize the femtosecond laser pulse as not impinging on the nanostructure, and no discrete ($n\hbar\omega$) electron energy gain or loss would be observed.

FIG. 5B is a simplified physical depiction of the interaction between the electron, photon, and evanescent field at the precise moment at t=0 when the electron packet, femtosecond laser pulse, and evanescent field are at maximum overlap at the carbon nanotube according to an embodiment of the present invention. When the laser pulse encounters the nanostructure (t=0), it creates the near-field excitations, and this interaction causes the surface field to oscillate with the electric field of the laser. Because the nanotube diameter (~140 nm) is much less than the wavelength of the light (519 nm), the field is confined (d<λ) by the dimensions of the tube (wire), and this confinement sets up an oscillating dipole in the structure. The intensity of the evanescent field extends beyond the structure of the nanotube and falls off exponentially with distance from the surface. Thus, evanescent fields effectively mediate the interaction between the 200 keV electron and the 2.4 eV photons in the femtosecond excitation pulse, but the absorption/emission processes only occur when both the electron and photon are overlapped in space at the nanostructure and in time at t=0.

FIG. 5C is a simplified physical depiction of the interaction between the electron, photon, and evanescent field during and immediately after the interaction (t>0) when the electron gains/loses energy equal to integer multiples of femtosecond laser photons according to an embodiment of the present invention. The inset in FIG. 5C illustrates two possible final energies in the continuum due to the free-free transitions between the imaging electron and the photons in the femtosecond laser pulse, wherein KE represents kinetic energy.

The orders of magnitude enhancement achieved according to embodiments of the present invention may be appreciated when comparing with time-averaged, CW mode of excitation. For a tightly focused CW laser ($10^6$ W/cm$^2$), the number of excitations on the timescale of the field is nearly five orders of magnitude less than achieved by embodiments of the present invention using ~100 GW/cm$^2$ irradiance. Further, for CW powers of about 10 W, it would be necessary for the nanostructures to dissipate the energy without significant structural damage. In some implementations described herein, the average power is typically on the order of 100 mW. The precise overlap of pulses according to embodiments of the present invention allows for signal acquisition times of only a few seconds, as every electron contributes to the gain/loss signal on the timescale of the field's existence. In contrast, for CW electron spectroscopy, the signal will be overwhelmed by a background whose magnitude is conditioned by the repetition rate and other factors. Finally, it should be noted that the process of $\pm n\hbar\omega$ absorption/emission described herein takes place for each single-electron, timed packet.

Utilizing embodiments of the present invention, the inventors have demonstrated that photon-induced near-field imaging with electrons is made possible by the precise overlap of ultrafast electron packets, intense ultrafast laser pulses, and nanostructures. These structure-mediated (electron-photon interaction) phenomena, as well as the spatiotemporal properties of the evanescent electric fields, can now be imaged in real space and on the femtosecond timescale. By knowing the distribution of the field and the control over its polarization and temporal behavior, it is possible to explore the nature of interfacial fields and their role in a variety of applications at the nanoscale of materials. Utilizing embodiments of the present invention, PINEM provides resolution extending into the domain of ultrafast electron microscopy: the atomic scale. Moreover, the systems described herein, which utilize inelastic interactions, the real space images (and diffraction), which are the result of elastic interactions, can easily be obtained by removing the energy filter, obviating the need for the scanning requirement of optical near-field methods. Additionally, embodiments of the present invention are applicable to imaging with sub-femtosecond electrons.

Figure 6:
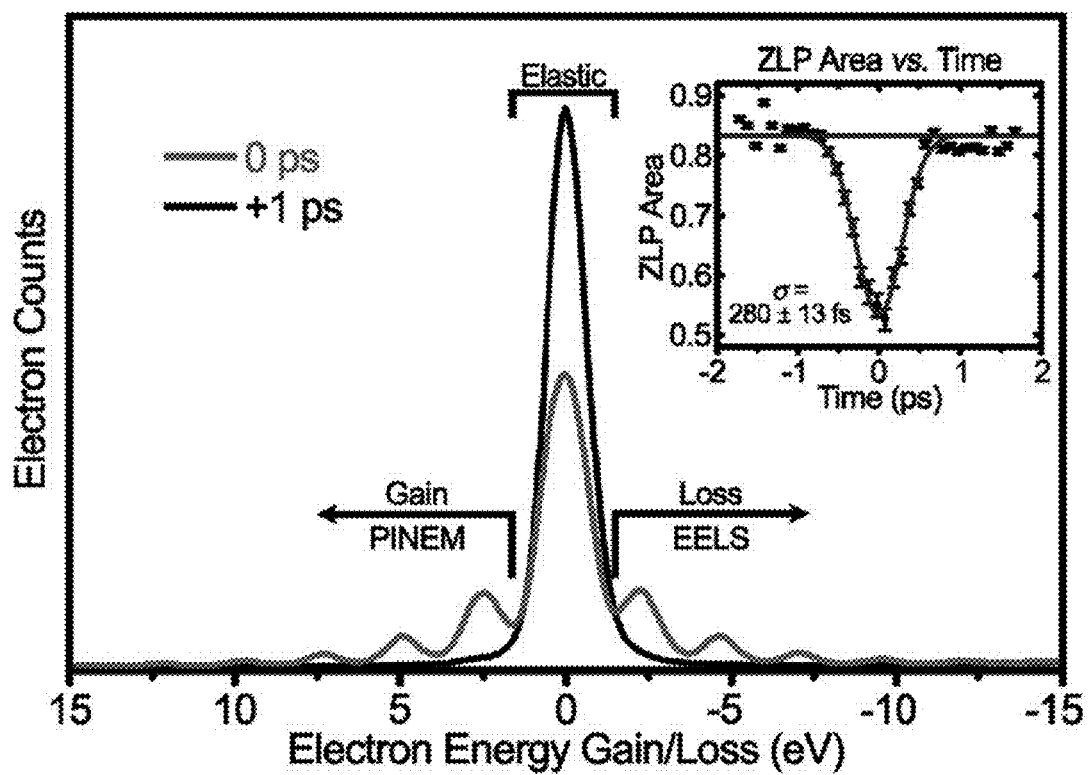
FIG. 6 is a plot illustrating temporally resolved electron energy spectra of a protein vesicle irradiated with an intense femtosecond laser pulse at two different delay times according to an embodiment of the present invention.

FIG. 6 is a plot illustrating temporally resolved electron energy spectra of a protein vesicle irradiated with an intense femtosecond laser pulse at two different delay times according to an embodiment of the present invention. FIG. 6 displays the region of the electron energy spectrum taken when the spatiotemporal overlap of the femtosecond laser pulse and electron packet is optimum (i.e., at a maximum) at a single protein vesicle and when they separate temporally by +1 ps (i.e., when the electron packet arrives at the vesicle 1 ps after the femtosecond laser pulse). As can be seen in FIG. 6, the t=0 ps spectrum shows loss and gain peaks occurring at integer multiples of the photon energy, whereas the t=+1 ps spectrum does not, similar to what was observed for non-biological materials. Whereas all regions of the spectrum can be selected and used to generate images, only those electrons that have gained energy (i.e., the gain region) are used in some embodiments. As illustrated herein, the elastic and loss regions can be used for imaging of the same specimen, e.g., in the bright-field mode. Thus, the spatial characteristics of the gain process can be directly visualized, as discussed below. In the inset of FIG. 6, the femtosecond temporal response of both the electron and photon pulses is shown as the change in the area of the zero-loss peak (ZLP) as a function of time, illustrating the feasibility of visualizing ultrafast dynamics with this technique. The fitted response gives $\sigma=280\pm13$ fs. Photon pulses of 250 fs in duration were utilized to obtain the data illustrated in FIG. 6.

As described more fully below, the methods and systems described herein have been utilized to image biological specimens with femtosecond temporal resolution. Imaging of the outer shell of liquid-filled protein vesicles and the cell structure of whole cells of *Escherichia coli*, both of which are not absorbing to the photon energy, and are of low-Z contrast, has been demonstrated. The spatial location of contrast enhancement is controlled via laser polarization, time resolution, and tomographic tilting.

Figures 7A, 7B:
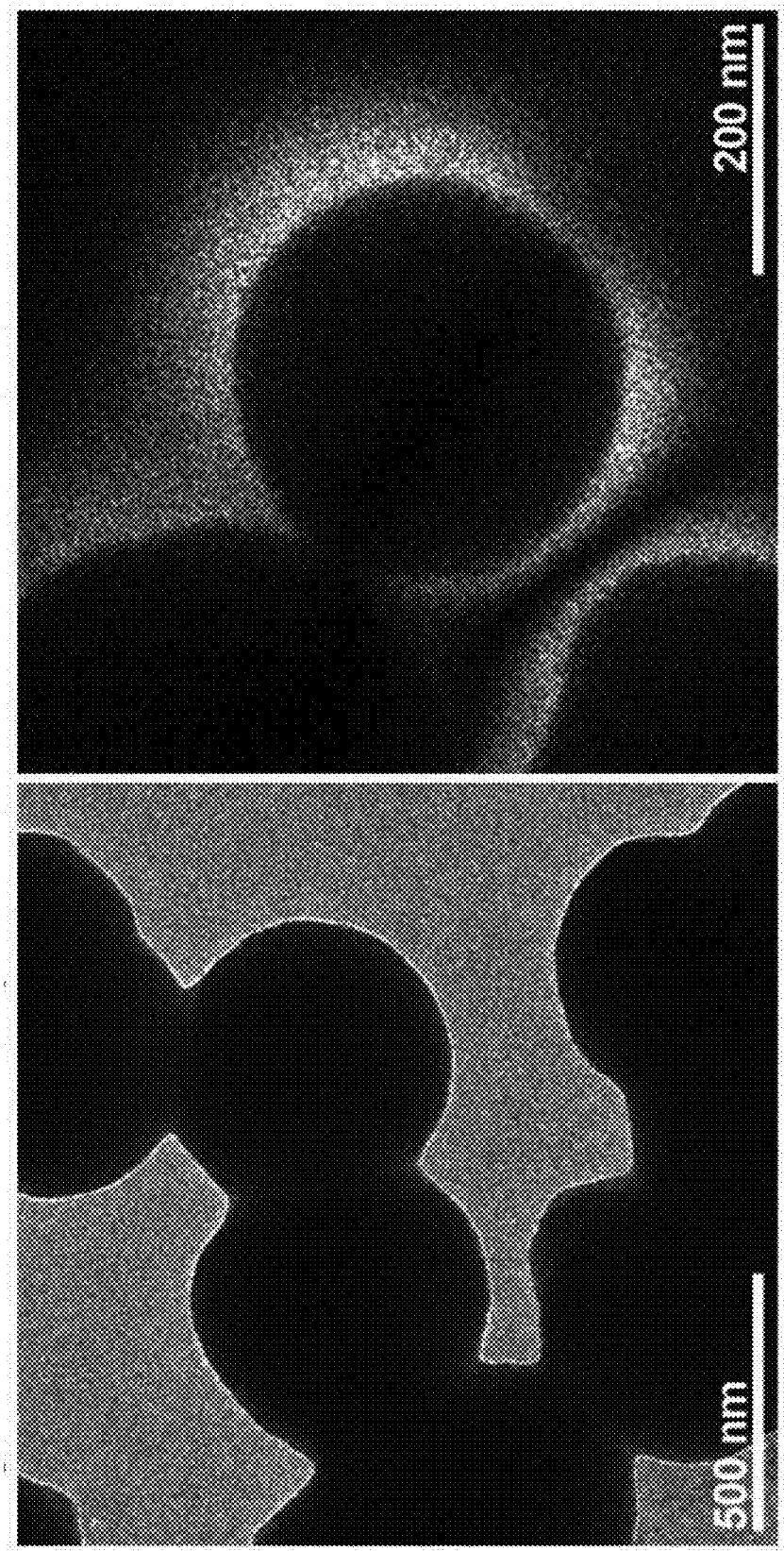
FIG. 7A is a bright-field TEM image of protein vesicles.
FIG. 7B is a PINEM image of a protein vesicles according to an embodiment of the present invention.

Embodiments of the present invention are applicable to the PINEM imaging of individual biological structures, biomimetic protein vesicles, and the like. The results from whole unstained *E. coli* cells are discussed below. FIG. 7A is a bright-field transmission electron microscopy (TEM) image of protein vesicles. FIG. 7B is a PINEM image of a protein vesicles according to an embodiment of the present invention. The vesicles are composed of a shell of covalently cross-linked BSA protein molecules encapsulating a liquid core and are useful as biomimetic cellular structures as well as for a wide range of practical purposes (e.g., drug delivery and contrast agents). The cross-linking is achieved through the formation of interprotein sulfur-sulfur bonds via oxidation of cysteine residues in the BSA molecules, and the structure of the individual particles is not highly denatured during vesicle formation. Therefore, a 500-nm vesicle with a 50-nm-thick shell will be comprised of ~500,000 individual BSA protein molecules, each of which occupies ~60 nm$^3$.

The bright-field (BF) image in FIG. 7A was obtained at a magnification of 27,500×, whereas the PINEM image in FIG. 7B was obtained at a magnification of 67,000×. The PINEM image was recorded at the maximum spatiotemporal overlap of the femtosecond laser pulse and electron packet although imaging is possible at other overlaps as described below. The raw PINEM image was filtered for noise removal, and the border around the vesicles in the BF image results from the slight defocus of the lens.

As discussed above, a PINEM image of a vesicle is formed by filtering the electrons such that those that have gained energy because of the PIN effect are used. The image is generated at or around the maximum spatiotemporal overlap of the laser pulse and electron packet (i.e., t=0). Referring to FIG. 7B, the PINEM imaging of the vesicle produces enhanced contrast at the edge, where the protein shell resides, relative to the remainder of the field of view. That is, the intensity far from the structure visualized in a typical bright-field image, which is responsible for the weakened contrast, is not present in PINEM. Here the effect shown in the images is the result of fields created by the dielectric (protein) shell, relative to vacuum, by the femtosecond laser pulse. This evanescent electric field at the surface of the vesicle is unique to nanostructures, and its strength decays exponentially with distance.

Beyond the enhanced contrast provided by PINEM, embodiments of the present invention also allow for the femtosecond temporal response of the PIN effect to be directly visualized and controlled. By changing the delay between the excitation laser pulse and the ultrashort electron packet impinging on the protein vesicle, the time dependence of the interaction can be followed as illustrated in FIGS. 8A-F.

FIGS. 8A-F are ultrafast high-magnification PINEM images of a protein vesicle according to an embodiment of the present invention. The response is remarkably ultrafast, with the PINEM contrast being significantly weaker after only 200 fs and essentially being zero at ±1 ps. The timing of the response in the PINEM images is consistent with that quantified from the ZLP of a single protein vesicle. Clearly, imaging the fields of concern here occurs on ultrashort time scales.

Referring to FIGS. 8A-F, ultrafast, polarization, and high-magnification PINEM imaging of a single protein vesicle are provided. FIGS. 8A-C are three PINEM images of the same protein vesicle, but obtained at different points in time (0 fs, +200 fs, and +1 ps). Each image was acquired at a magnification of 53,000×. Each image was filtered for noise removal, and the contrast limits are all set to the same range. FIGS. 8D-F are PINEM images of a protein vesicle generated with the femtosecond laser light linearly polarized in a plane indicated by the double-headed arrows (8D and 8E), as well as a PINEM image of a portion of a protein vesicle obtained at high magnification (8F). The polarization images were obtained at a magnification of 67,000×, whereas the high-magnification image was obtained at 200,000×. Each pixel in the high-magnification image corresponds to 8.8 Å. The raw images were filtered for noise removal.

The controllability and high-spatial resolution capabilities of the PINEM technique for biological imaging are displayed in FIGS. 8A-F. As can be seen, the spatial location of the PIN effect around the structure is accomplished by changing the orientation of the plane of polarization of the femtosecond laser pulse with respect to the vesicle orientation. The location of the gain regions appears as diametrically opposed contrast enhancements, the specific locations of which precisely follow the laser polarization. A high-magnification PINEM image (pixel size=8.8 Å) of one side of a protein vesicle demonstrates the potential to visualize single cellular particles being tens of nanometers in diameter (e.g., ribosomes), but with the accompanying femtosecond temporal resolution and enhanced contrast capabilities afforded by the techniques described herein. It should be noted that the PINEM signal scales with the number of laser photons impinging upon the specimen. Because the vesicles do not absorb the 532-nm laser light, substantial fluences can be used to form images without causing photothermal damage.

To demonstrate the use of PINEM to image biological structures with increased complexity relative to simple protein vesicles, we imaged whole unstained and unfixed cells of the common bacteria E. coli. Whereas the E. coli cells are much more complex than a simple vesicle, they are ideal model systems for demonstrating biological imaging with PINEM. One reason for this is that they are prokaryotes and thus lack the intracellular complexity of eukaryotic cells (e.g., a membrane-bound nucleus, mitochondria, Golgi bodies, etc.). Another reason is that the E. coli cell has been extensively imaged with electron microscopy, and several high-resolution studies of the ultrastructure have been published.

Figures 9A, 9B:
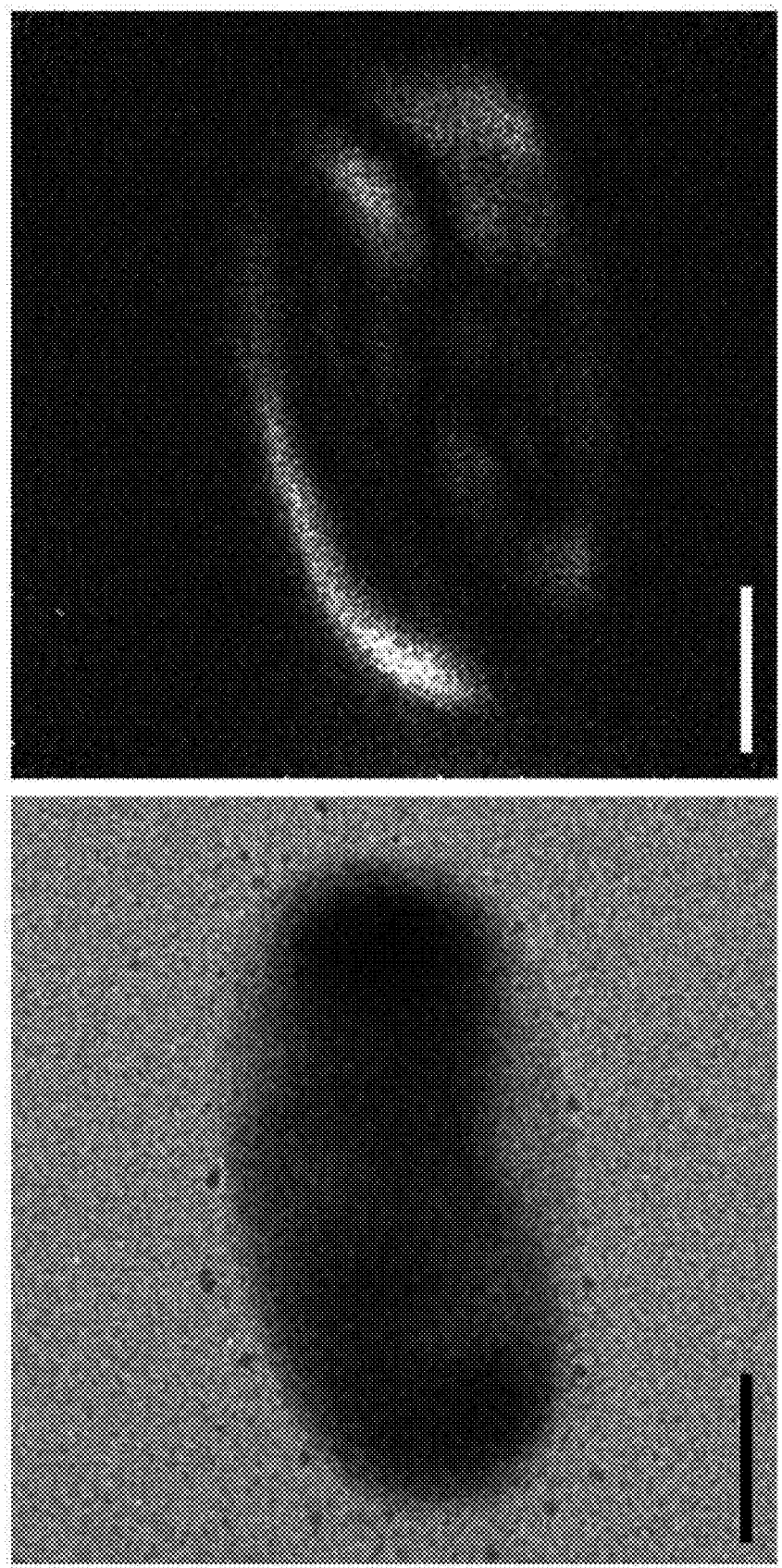
FIG. 9A is a bright-field TEM image of a whole unstained and unfixed *E. coli* cell.
FIG. 9B is a PINEM image of the whole unstained and unfixed *E. coli* cell according to an embodiment of the present invention.

FIG. 9A is a bright-field TEM image of a whole unstained and unfixed E. coli cell. FIG. 9B is a PINEM image of the whole unstained and unfixed E. coli cell according to an embodiment of the present invention. Both images were obtained at a magnification of 19,000×. The PINEM image in FIG. 9B was filtered for noise removal. (Scale bars, 500 nm). Referring to FIG. 9A, the bright-field image displays the mass-thickness contrast of the cell and with some variations within the cell. The nucleoid (i.e., DNA material) is visible in the upper portion of the cell as a dark (thick) region, as are many small particles of ~20 nm diameter, presumably ribosomes, dispersed throughout the cytoplasm. We also observe the cellular envelope (i.e., the material comprising the outer and cytoplasmic membranes). Indeed, the ~50 nm gap between the outer and cytoplasmic membranes, which contained the peptidoglycan layer, is visible.

Referring to FIG. 9B, the PINEM image of whole unstained and unfixed cells was generated by maximizing the spatiotemporal overlap of the femtosecond laser pulse and electron packet at the specimen. Several interesting features of the PINEM images should be noted. Unlike the protein vesicles discussed above, enhanced contrast is observed at both the outer and inner regions of the cell, which is because portions of the cell are thin relative to the thick liquid-filled vesicles, the result of which is similar to thickness contrast in bright-field TEM and UEM images. The PINEM images illustrate that electrons passing through the thinner regions of the cell experience gains and losses near intracellular topological features, a result that bodes well for imaging ultrastructure with this technique.

FIGS. 10A-F are ultrafast high-magnification PINEM images of the whole unstained and unfixed E. coli cell according to an embodiment of the present invention. These figures provide insight into the time scale of the PINEM of the cells. By changing the delay time between the femtosecond laser pulse and electron packet incident at the cell, the time dependence of the image was followed, with results similar to that achieved with the (dielectric) protein vesicles and inorganic conducting materials. Again, the response is ultrafast, with the contrast weakening within 200 fs of maximum laser pulse and electron packet overlap. Thus, the observed enhancement is optimum in UEM.

FIGS. 10A-C illustrate pseudocolor PINEM images and FIGS. 10D-F illustrate the corresponding three-dimensional surface plots of the same cell, but obtained at different points in time (0 fs, +200 fs, and +2 ps). Each image was acquired at a magnification of 53,000×, and all were filtered for noise removal. The contrast limits are set to the same range for each row of images. (Scale bars, 500 nm).

Additionally, embodiments of the present invention provide tomographic-type images and demonstrate the effect of photon polarization. FIGS. 11A-E are ultrafast high-magnification PINEM images of the whole unstained and unfixed E.

*coli* cell according to an embodiment of the present invention. The images illustrated in FIGS. 11A and 11B are PINEM images taken at different specimen tilt angles, 0 and +30°, respectively. The femtosecond laser light was linearly polarized in a plane indicated by the double-headed arrows. The polarization images were obtained at a magnification of 19,000×. The raw images were filtered for noise removal. As the tilt angle of the specimen is changed, the spatial distribution and strength of contrast varies. In conventional electron tomography, images obtained at different specimen tilt angles can be combined to construct 3D images of biological macromolecules, with the added capability of energy filtering for generating element-specific 3D maps. The PINEM images obtained at different tilt angles demonstrate that the technique could be used to generate similar tomographic images, but with the added capabilities of enhanced contrast and ultrafast temporal resolution.

FIGS. 11C-E display a series of PINEM images obtained at different specimen tilt angles, which are shown in the upper right corner of each frame. The images were obtained at a magnification of 53,000× at the maximum spatiotemporal overlap of the femtosecond laser pulse and electron packet. The raw PINEM images were filtered for noise removal, and the contrast limits are set to the same range. (Scale bar, 500 nm in all images shown). The polarization effect illustrated is consistent with the concept of nanoscale directional change of the field. Embodiments of the present invention provide for multi-dimensional imaging (for example 5 dimensions) including the dimensions of time, space, wavelength, electron energy, polarization, tilt angle, and the like.

As described above, embodiments of the present invention are useful for providing contrast enhancement in imaging and techniques useful for imaging of both biomimetic protein vesicles and whole unstained, unsliced, and unfixed cells. Embodiments enable the visualization of single particles of nanometer-scale dimensions, but with the added capability of femtosecond temporal resolution. The controllability of the imaging of biological structures, through the laser pulse polarization and specimen tilting, adds two other dimensions for selectivity in imaging.

According to some embodiments, the photon wavelength is varied to map different dimensions, to further improve the spatial resolution by near-resonance confinement of the particle field, and the energy resolution for mapping all structures at once. One of ordinary skill in the art would recognize many variations, modifications, and alternatives.

Figure 12:
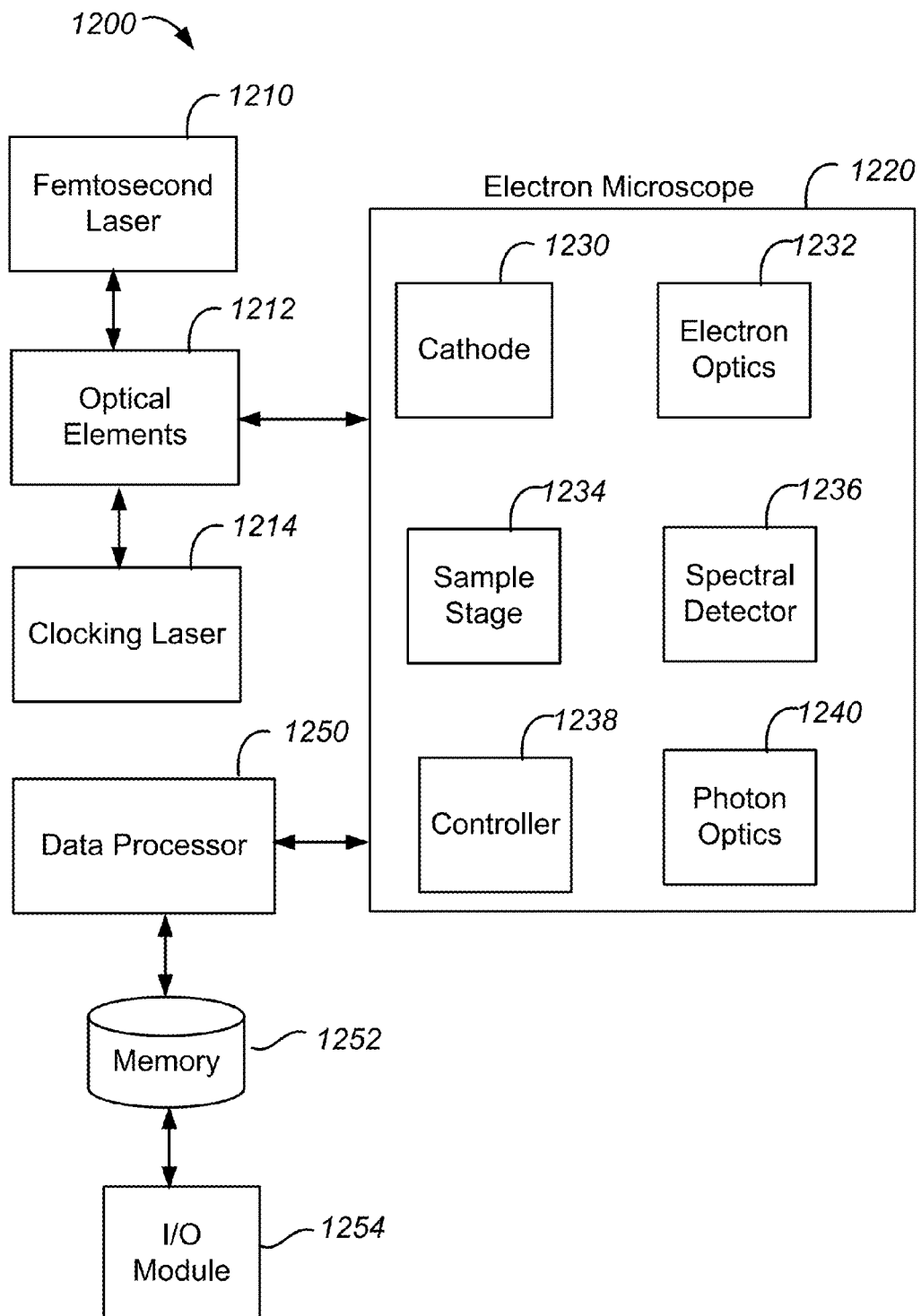
FIG. 12 is a simplified schematic diagram illustrating a PINEM system according to an embodiment of the present invention.

FIG. 12 is a simplified schematic diagram illustrating a PINEM system according to an embodiment of the present invention. The PINEM system 1200 includes a femtosecond laser 1210 and a clocking laser 1214. Optical elements 1212 are utilized to provide multiple laser beams to electron microscope 1220. As an example, one or more frequency conversion stages are used to provide doubled, tripled, quadrupled beams or the like. One or more beam splitters and an optical delay stage can be used to provide multiple beams arriving at the sample stage 1234 at different times. As described above, the femtosecond laser 1210 can be used to provide a beam for electron beam generation and a beam for sample illumination. The clocking laser 1214 can be used to provide a beam to initiate dynamic processes in the sample.

The electron microscope 1220 includes a cathode used to generate the electron beam, electron optics 1232 to collimate and focus the electron beam and to direct the electron beam to impinge on the sample stage 1234. Photon optics 1240 can be used to direct the intense femtosecond pulses and/or the clocking pulses inside the chamber of the electron microscope. A spectral detector 1236, for example, a Gatan Imaging Filter, is provided to detect electrons that have absorbed energy due to their interactions with the intense femtosecond pulse.

Controller 1238 interacts with data processor 1250, memory 1252, and the input/output (I/O) module 1254 to enable a user to control the PINEM system and to obtain data and images from the PINEM system. The data processor 1250, the memory 1252, and the I/O module 1254 may be provided as part of a computer system. The data processor 1250 represents a central processing unit of any type of architecture, such as a CISC (Complex Instruction Set Computing), RISC (Reduced Instruction Set Computing), VLIW (Very Long Instruction Word), or a hybrid architecture, although any appropriate processor may be used. The processor 1250 executes instructions and includes that portion of a computer that controls the operation of the entire computer. Although not depicted in FIG. 12, the processor 1250 typically includes a control unit that organizes data and program storage in memory and transfers data and other information between the various parts of the computer. The processor 1250 receives input data from the I/O device input module 1254 a network (not shown), reads and stores code and data in the memory 1252 and presents data to the I/O module 1254. Although the PINEM system 1200 is shown to contain only a single processor 1250, the disclosed embodiment applies equally to computers that may have multiple processors.

The memory 1252 represents one or more mechanisms for storing data. For example, the memory 1252 may include read-only memory (ROM), random access memory (RAM), magnetic disk storage media, optical storage media, flash memory devices, and/or other machine-readable media. In other embodiments, any appropriate type of storage device may be used. Although only one memory 1252 is shown, multiple storage devices and multiple types of storage devices may be present. Further, the memory 1252 may be distributed across multiple computers, for example on a server.

The memory 1252 includes a controller (not shown in FIG. 12) and data items. The controller includes instructions capable of being executed on the processor 1250 to carry out the methods described more fully throughout the present specification. In another embodiment, some or all of the functions are carried out via hardware in lieu of a processor-based system. In one embodiment, the controller is a web browser, but in other embodiments the controller may be a database system, a file system, an electronic mail system, a media manager, an image manager, or may include any other functions capable of accessing data items. Of course, the memory 1252 may also contain additional software and data (not shown), which is not necessary to understand the invention.

The I/O module 1254 is used to receive input and display output to the user. The I/O module 1254 may be a liquid crystal display (LCD) well-known in the art of computer hardware. But, in other embodiments the I/O module 1254 may be replaced with a gas or plasma-based flat-panel display or a traditional cathode-ray tube (CRT) display. In still other embodiments, any appropriate display device may be used. Although only one I/O module 1254 is shown, in other embodiments any number of output devices of different types, or of the same type, may be present. In an embodiment, the I/O module 1254 displays a user interface. The I/O module 1254 may also include one or more input devices such as a keyboard, mouse or other pointing device, trackball, touchpad, touch screen, keypad, microphone, voice recognition device, or any other appropriate mechanism for the user to input data to the system and manipulate the user interface previously discussed.

Figure 13:
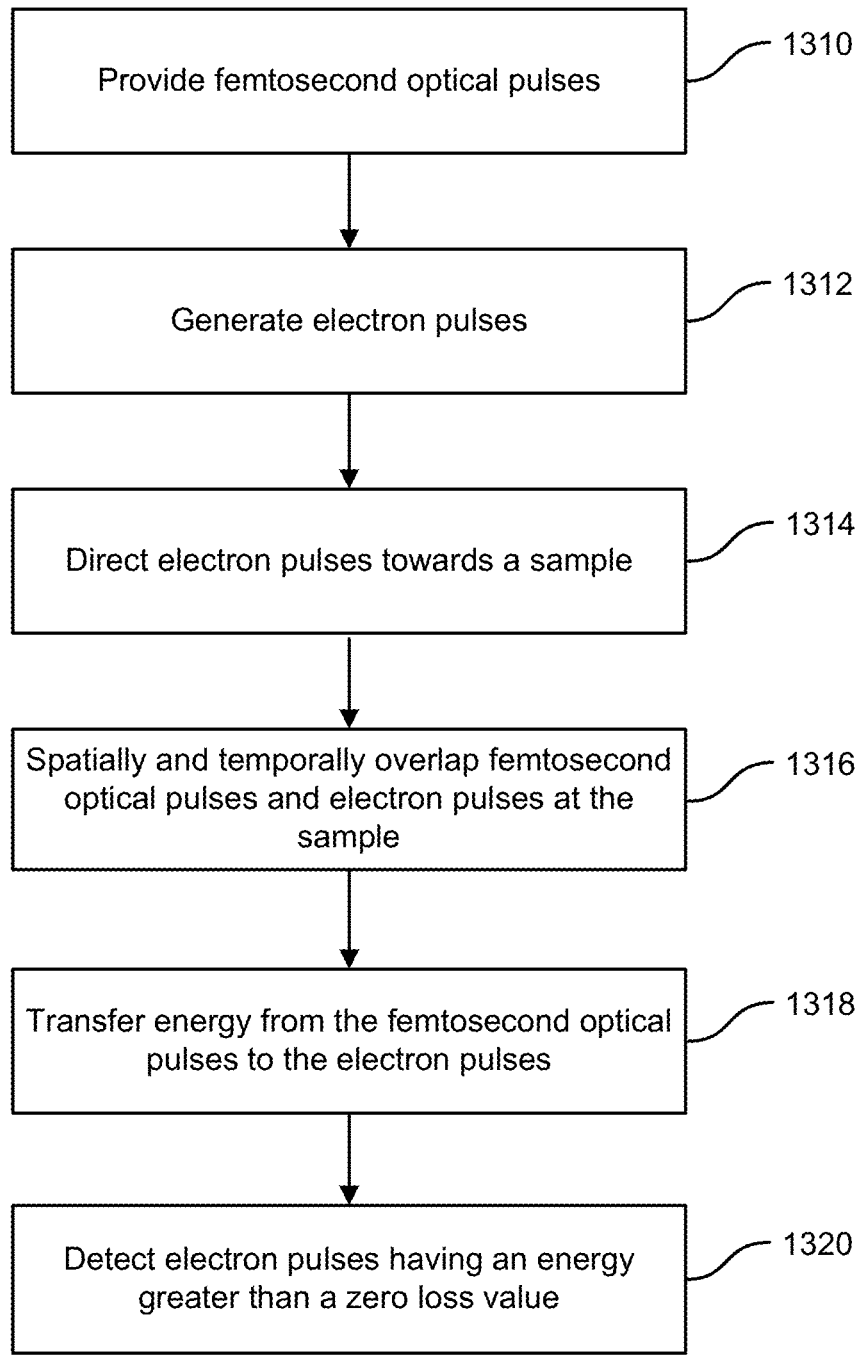
FIG. 13 is a simplified flowchart illustrating a method of obtaining PINEM images according to an embodiment of the present invention.

FIG. 13 is a simplified flowchart illustrating a method of obtaining PINEM images according to an embodiment of the present invention. The method 1300 includes providing femtosecond optical pulses (1310), generating electron pulses (1312), and directing the electron pulses towards a sample (1314). The method also includes overlapping the femtosecond optical pulses and the electron pulses spatially and temporally at the sample (1316). As described more fully throughout the present specification, the spatial and temporal overlap provides for nanometer scale spatial resolution and femtosecond scale temporal resolution. In an embodiments, a time delay between each of the pulses of the femtosecond optical pulses and a corresponding pulse of the electron pulses is less than 2 ps. Referring to FIG. 4A, for time delays greater than 1 ps, the energy transfer process is decreasing in magnitude.

The method also includes transferring energy from the femtosecond optical pulses to the electron pulses (1318) and detecting electron pulses having an energy greater than a zero loss value (1320). As an example, the zero loss value can be associated with an initial energy of the electron pulses (e.g., 200 keV). As described throughout the present specification, the energy greater than the zero loss value can include an energy equal to an initial energy of the electron pulses plus one or more quanta of energy associated with the femtosecond optical pulses.

It should be appreciated that the specific steps illustrated in FIG. 13 provide a particular method of obtaining PINEM images according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of imaging a sample, the method comprising:
providing a first set of optical pulses and a second set of optical pulses;
directing the first set of optical pulses to impinge on a cathode;
generating a set of electron pulses in response to the first set of pulses, wherein the set of electron pulses are characterized by a first energy;
directing the set of electron pulses to impinge on a sample;
directing the second set of optical pulses to impinge on the sample;
transmitting the set of electron pulses through the sample, the set of electron pulses transmitted through the sample being representative of an image of the sample;
detecting the set of electron pulses transmitted through the sample to provide a data signal as a function of electron energy and associated with the image of the sample, wherein an energy of the set of electron pulses transmitted through the sample is different than the first energy; and
transmitting the data signal to an output device.

2. The method of claim 1 wherein the first set of optical pulses and second set of optical pulses comprise femtosecond optical pulses.

3. The method of claim 1 wherein the energy of the set of electron pulses transmitted through the sample is higher than the first energy.

4. The method of claim 1 wherein the energy of the set of electron pulses transmitted through the sample is lower than the first energy.

5. The method of claim 1 wherein the set of electron pulses impinges on a sample at a first time, and wherein the second set of optical pulses impinges on the sample at a second time.

6. The method of claim 5 wherein the difference between the first time and the second time is less than 2 ps.

7. The method of claim 1 further comprising aligning a polarization of the second set of optical pulses with respect to a primary axis of the sample.

8. A method of obtaining electron microscopy images, the method comprising:
providing optical pulses;
generating electron pulses;
directing the electron pulses towards a sample;
overlapping the optical pulses and the electron pulses in a vicinity of the sample;
transferring energy between the optical pulses and the electron pulses; and
detecting the electron pulses as a function of electron energy and having an energy greater than a zero loss value.

9. The method of claim 8 wherein the optical pulses comprise femtosecond optical pulses.

10. The method of claim 8 wherein the energy is transferred from the optical pulses to the electron pulses.

11. The method of claim 8 wherein the energy is transferred from the electron pulses to the optical pulses.

12. The method of claim 8 wherein the optical pulses and the electrical pulses are overlapped spatially and temporally.

13. The method of claim 8 wherein the optical pulses and the electron pulses are overlapped temporally comprising a time delay between each of the pulses of the optical pulses and a corresponding pulse of the electron pulses of less than 2 ps.

14. The method of claim 8 further comprising aligning a polarization of the optical pulses with respect to a primary axis of the sample.

15. A method of imaging a sample, the method comprising:
providing an optical pulse characterized by a predetermined polarization;
providing an electron pulse;
overlapping the optical pulse and the electron pulse temporally in a vicinity of a sample, wherein the sample has a spatial feature defined by a primary axis;
detecting the electron pulse after propagation past the vicinity of the sample;
a) determining an electron energy of the electron pulse to provide a data signal;
b) modifying the predetermined polarization with respect to the primary axis; and
c) repeating a) and b) until the predetermined polarization is substantially perpendicular to the primary axis.

16. The method of claim 15 wherein the optical pulses comprise femtosecond optical pulses.

17. The method of claim 15 wherein the electron energy of the electron pulse is greater than a predetermined energy plus a number of quanta of photon energy when the predetermined polarization is substantially perpendicular to the primary axis.

18. The method of claim 15 wherein the primary axis is a longitudinal axis of the sample.

19. The method of claim 15 wherein adjusting a tilt angle modifies the predetermined polarization of the optical pulse with respect to the primary axis.

20. The method of claim 15 further comprising combining a plurality of data signals with respect to one or more spatial orientations of the predetermined polarization to generate a three-dimensional image of the sample.

* * * * *